United States Patent
Bu et al.

(10) Patent No.: US 11,244,990 B2
(45) Date of Patent: Feb. 8, 2022

(54) DISPLAY CONTROL CIRCUIT AND DRIVING METHOD THEREOF, DISPLAY PANEL AND MANUFACTURING AND CONTROLLING METHODS THEREOF

(71) Applicants: Beijing BOE Display Technology Co., Ltd., Beijing (CN); BOE Technology Group Co., Ltd., Beijing (CN)

(72) Inventors: Qianqian Bu, Beijing (CN); Weipin Hu, Beijing (CN)

(73) Assignees: Beijing BOE Display Technology Co., Ltd.; BOE Technology Group Co., Ltd

( * ) Notice: Subject to any disclaimer, the term of this patent is extended or adjusted under 35 U.S.C. 154(b) by 72 days.

(21) Appl. No.: 16/522,736

(22) Filed: Jul. 26, 2019

(65) Prior Publication Data
US 2020/0043963 A1    Feb. 6, 2020

(30) Foreign Application Priority Data
Aug. 3, 2018  (CN) .......................... 201810878142.6

(51) Int. Cl.
*H01L 27/32* (2006.01)
*G09G 3/3233* (2016.01)

(52) U.S. Cl.
CPC ....... *H01L 27/3232* (2013.01); *G09G 3/3233* (2013.01); *G02F 2201/44* (2013.01); *G09G 2300/023* (2013.01); *G09G 2300/046* (2013.01); *G09G 2300/0809* (2013.01); *G09G 2320/0626* (2013.01); *G09G 2330/021* (2013.01)

(58) Field of Classification Search
CPC ........... H01L 27/3232; H01L 2227/323; H01L 27/3244; G09G 3/3233; G09G 2320/0626; G09G 2300/023; G09G 2330/021; G09G 2300/046; G09G 2300/0809; G09G 2300/0819; G09G 3/3225; G09G 2300/0426; G02F 2201/44
See application file for complete search history.

(56) References Cited

U.S. PATENT DOCUMENTS

| | | | |
|---|---|---|---|
| 2016/0299387 A1* | 10/2016 | Yamazaki | G02F 1/1362 |
| 2017/0052418 A1 | 2/2017 | Zhang et al. | |
| 2017/0075155 A1* | 3/2017 | Oikawa | H01L 29/78648 |
| 2018/0114489 A1 | 4/2018 | Tan et al. | |

FOREIGN PATENT DOCUMENTS

| CN | 105093763 A | 11/2015 |
|---|---|---|
| CN | 106324877 A | 1/2017 |

OTHER PUBLICATIONS

First office action of Chinese application No. 201810878142.6 dated Mar. 11, 2020.

* cited by examiner

*Primary Examiner* — Su C Kim
(74) *Attorney, Agent, or Firm* — Fay Sharpe LLP

(57) ABSTRACT

Provided are a display control circuit and a driving method thereof, and a display panel and manufacturing and controlling methods thereof, in the field of display technology. The display control circuit includes: a driving sub-circuit configured to provide a control signal from the control signal terminal to the control node; a first switching sub-circuit configured to provide a data signal from the data signal terminal to the OLED; and a second switching sub-circuit configured to provide the data signal to the liquid crystal display unit. The first switching sub-circuit and the second switching sub-circuit operate at different periods of time.

19 Claims, 21 Drawing Sheets

---

Controlling the OLED display substrate in the display panel to operate, and controlling the LCOS liquid crystal cell in the display panel to stop operation when a display instruction indicating a first display mode is received — 301

Controlling the OLED display substrate to stop operation, and controlling the LCOS liquid crystal cell to operate when the display instruction indicating a second display mode is received — 302

DISPLAY CONTROL CIRCUIT AND DRIVING METHOD THEREOF, DISPLAY PANEL AND MANUFACTURING AND CONTROLLING METHODS THEREOF

CROSS-REFERENCE TO RELATED APPLICATION

This application claims priority to Chinese Patent Application No.: 201810878142.6 filed on Aug. 3, 2018 and entitled "Display Panel and Manufacturing Method thereof, Display Device and Display Control Method thereof" the entire contents of which are incorporated herein by reference.

TECHNICAL FIELD

The present disclosure relates to the field of display technology, and more particular to a display control method circuit and a driving method thereof, a display panel and manufacturing and controlling methods thereof.

BACKGROUND

The organic light-emitting diode (OLED) as a self-light-emitting device is increasingly applied to the display field for the characteristics, such as low energy consumption, fast response, and wide viewing angle, etc.

SUMMARY

The embodiments of the present disclosure provide a display control method circuit and a driving method thereof, a display panel and manufacturing and controlling methods thereof.

According to an aspect of the embodiments of the present disclosure, there is provided a display control circuit, comprising: a driving sub-circuit, a first switching sub-circuit, and a second switching sub-circuit; wherein the driving sub-circuit is configured to be connected to a gate driving signal terminal, a control signal terminal, and a control node respectively, and configured to provide a control signal from the control signal terminal to the control node under control of a gate driving signal from the gate driving signal terminal;

the first switching sub-circuit is configured to be connected to the control node, a data signal terminal, and an organic light-emitting diode (OLED) in a display panel respectively, and configured to provide a data signal from the data signal terminal to the OLED under control of the control node; and the second switching sub-circuit is configured to be connected to the control node, the data signal terminal, and a liquid crystal display unit in a liquid crystal on silicon (LCOS) liquid crystal cell respectively, and configured to provide the data signal to the liquid crystal display unit under control of the control node, wherein the first switching sub-circuit and the second switching sub-circuit operate in at different periods of time.

Optionally, the driving sub-circuit comprises: a driving transistor;

wherein a gate electrode of the driving transistor is connected to the gate driving signal terminal, a first electrode of the driving transistor is connected to the control signal terminal, and a second electrode of the driving transistor is connected to the control node.

Optionally, the first switching sub-circuit comprises: a first transistor;

wherein a gate electrode of the first transistor is connected to the control node, a first electrode of the first transistor is connected to the data signal terminal, and a second electrode of the first transistor is connected to the OLED.

Optionally, the second switching sub-circuit comprises: a second transistor;

wherein a gate electrode of the second transistor is connected to the control node, a first electrode of the second transistor is connected to the data signal terminal, and a second electrode of the second transistor is connected to the liquid crystal display unit.

According to another aspect of the embodiments of the present disclosure, there is provided a method for driving a display control circuit, wherein the method is applied to drive the display control circuit in the embodiments of the present disclosure, the display control circuit comprises: a driving sub-circuit, a first switching sub-circuit, and a second switching sub-circuit. The method comprises:

controlling to provide a gate driving signal at a first potential and a first control signal at a first potential to the driving sub-circuit when a display instruction indicating a first display mode is received, wherein the driving sub-circuit provides the first control signal to the control node under control of the gate driving signal, and the first switching sub-circuit provides the data signal from the data signal terminal to the OLED in the display panel under control of the control node; and controlling to provide a gate driving signal at a first potential and providing a second control signal at a second potential to the driving sub-circuit when a display instruction indicating a second display mode is received, wherein the driving sub-circuit provides the second control signal to the control node under control of the gate driving signal, and the second switching sub-circuit provides the data signal to the liquid crystal display unit in the display panel under control of the control node;

wherein, the first display mode and the second display mode are determined based on an ambient light brightness of environment in which the display panel is, and an ambient light brightness that the first display mode corresponds to is greater than an ambient light brightness that the second display mode corresponds to.

According to yet another aspect of the embodiments of the present disclosure, there is provided a display panel, comprising:

a silicon wafer;

a display control circuit layer, an OLED display substrate, and a transparent cover plate which are sequentially laminated on one side of the silicon wafer, wherein the display control circuit layer comprises: a plurality of display control circuits, and the OLED display substrate comprises a plurality of OLEDs; and an LCOS liquid crystal cell on another side of the silicon wafer, wherein the LCOS liquid crystal cell comprises a plurality of liquid crystal display units, and the another side is opposite to the one side, wherein the display control circuit comprises: a first switching sub-circuit configured to control an operating state of the OLED, a second switching sub-circuit configured to control an operating state of the liquid crystal display unit, and a driving sub-circuit configured to control operating states of the first switching sub-circuit and the second switching sub-circuit, wherein the first switching sub-circuit and the second switching sub-circuit operate at different periods of time.

Optionally, the driving sub-circuit comprises: a driving transistor, the first switching sub-circuit comprises: a first transistor, and the second switching sub-circuit comprises: a second transistor.

Optionally, the display panel has a plurality of sub-pixel regions, each of the sub-pixel regions has the OLED, the liquid crystal display unit, and the display control circuit therein, and the display control circuit layer comprises:

Q ion implantation regions in each of the sub-pixel regions in the silicon wafer, wherein each ion implantation region comprises a source-drain electrode pattern and an active pattern in which implanted ions have opposite polarities, the implanted ions of the active patterns in at least two ion implantation regions in each of the sub-pixel regions have opposite polarities, the source-drain electrode pattern comprises a source electrode and a drain electrode, and Q is a total number of transistors in the sub-pixel region;

a gate insulating layer on a side with the ion implantation regions of the silicon wafer; and a gate electrode pattern on a side of the gate insulating layer away from the silicon wafer, wherein the gate electrode pattern comprises a plurality of gate electrodes, and an orthographic projection of each gate electrode on the silicon wafer is between a source electrode and a drain electrode in one ion implantation region.

Optionally, the display control circuit layer further comprises:

a first planarization layer on a side of the gate electrode pattern away from the silicon wafer; and a conductive pattern on a side of the first planarization layer away from the silicon wafer, wherein the conductive pattern comprises a first sub-pattern and a second sub-pattern which are insulated from each other in each sub-pixel region, the first sub-pattern is respectively connected to a gate electrode of a first transistor, a gate electrode of a second transistor, and a first electrode of a driving transistor in a sub-pixel region where the first sub-pattern is, and the second sub-pattern is connected to a first electrode of a second transistor in the pixel region where the second sub-pattern is.

Optionally, the LCOS liquid crystal cell comprises: a transparent electrode layer, a liquid crystal layer, and a transparent substrate which are sequentially laminated on another side of the silicon wafer, the transparent electrode layer comprises a plurality of transparent electrodes, and the transparent electrodes are connected to an output terminal of the second switching sub-circuit.

Optionally, the display panel has a plurality of sub-pixel regions, each of the sub-pixel regions comprises a display region and a non-display region, the display control circuit is in the non-display region, and the display panel further comprises: a light-transmitting material in the display region and filled between the OLED display substrate and the transparent electrode layer.

Optionally, the OLED display substrate comprises: a first electrode layer, a self-light-emitting layer and a second electrode layer which are laminated, the first electrode layer comprises a plurality of first electrode blocks and the first electrode blocks are connected to the output terminal of one first switching sub-circuit.

Optionally, a display side of the display panel is a side where the LCOS liquid crystal cell is.

According to still yet another aspect of the embodiments of the present disclosure, there is provided a method for manufacturing a display panel, comprising:

forming a display control circuit layer on one side of a silicon wafer with the silicon wafer as a substrate, wherein the display control circuit layer comprises: a plurality of display control circuits;

forming an OLED display substrate on the side of the silicon wafer on which the display control circuit layer is formed, wherein the OLED display substrate comprises a plurality of OLEDs;

disposing a transparent cover plate on a side of the OLED display substrate away from the silicon wafer; and forming an LCOS liquid crystal cell on another side of the silicon wafer with the transparent cover plate as a substrate, wherein the LCOS liquid crystal cell comprises a plurality of liquid crystal display units, and the another side is opposite to the one side;

wherein the display control circuit comprises: a first switching sub-circuit configured to control an operating state of the OLED, a second switching sub-circuit configured to control an operating state of the liquid crystal display unit, and a driving sub-circuit configured to control operating states of the first switching sub-circuit and the second switching sub-circuit, wherein the first switching sub-circuit and the second switching sub-circuit operate at different periods of time.

Optionally, the driving sub-circuit comprises: a driving transistor, the first switching sub-circuit comprises: a first transistor, the second switching sub-circuit comprises: a second transistor, and forming a display control circuit layer on one side of the silicon wafer with the silicon wafer as a substrate comprises:

forming a plurality of driving transistors, a plurality of first transistors, and a plurality of second transistors on one side of the silicon wafer with the silicon wafer as a substrate.

Optionally, the display panel has a plurality of sub-pixel regions, each of the sub-pixel regions has the OLED, the liquid crystal display unit, and the display control circuit therein, and forming a plurality of driving transistors, a plurality of first transistors, and a plurality of second transistors on one side of the silicon wafer with the silicon wafer as a substrate comprises:

performing ion implantation on the silicon wafer by a first ion implantation process to obtain Q ion implantation regions in each of the sub-pixel regions in the silicon wafer, wherein implanted ions in at least two ion implantation regions in each of the sub-pixel regions have opposite polarities, and Q is a total number of transistors in the sub-pixel region;

forming a gate insulating layer on one side of the silicon wafer on which the ion implantation regions are formed;

forming a gate electrode pattern on a side of the gate insulating layer away from the silicon wafer, wherein the gate electrode pattern comprises a plurality of gate electrodes, and an orthographic projection of each gate electrode on the silicon wafer is within one ion implantation region; and forming a source-drain electrode pattern and an active pattern in each ion implantation region of the silicon wafer by a second ion implantation process, wherein a portion, in which ions are implanted by the second ion implantation process, of the ion implantation region is the source-drain electrode pattern, a portion, in which ions are not implanted by the second ion implantation process, of the ion implantation region is the active pattern, and implanted ions in the source-drain electrode pattern and in the active pattern in the same ion implantation region have opposite polarities, the source-drain electrode pattern comprises a source electrode and a drain electrode, and an orthographic projection of each gate electrode on the silicon wafer is between the source electrode and the drain electrode in one ion implantation region.

Optionally, after forming the plurality of driving transistors, the plurality of first transistors, and the plurality of second transistors on one side of the silicon wafer with the silicon wafer as a substrate, forming a display control circuit layer on one side of the silicon wafer with the silicon wafer as a substrate further comprises:

forming a first planarization layer on the side of the silicon wafer on which the plurality of driving transistors, the plurality of first transistors, and the plurality of second transistors are formed; and forming a conductive pattern on a side of the first planarization layer away from the silicon wafer, wherein the conductive pattern comprises a first sub-pattern and a second sub-pattern which are insulated from each other in each sub-pixel region, the first sub-pattern is respectively connected to a gate electrode of a first transistor, a gate electrode of a second transistor, and a first electrode of a driving transistor in a sub-pixel region where the first sub-pattern is, and the second sub-pattern is connected to a first electrode of a second transistor in the pixel region where the second sub-pattern is.

Optionally, forming an LCOS liquid crystal cell on another side of the silicon wafer with the transparent cover plate as a substrate comprises:

forming a transparent electrode layer on another side of the silicon wafer with the transparent cover plate as a substrate, wherein the transparent electrode layer comprises a plurality of transparent electrodes, and the transparent electrodes are connected to an output terminal of the second switching sub-circuit; and forming a liquid crystal layer and a transparent substrate on a side of the transparent electrode layer away from the silicon wafer to obtain the LCOS liquid crystal cell.

Optionally, the display panel has a plurality of sub-pixel regions, the sub-pixel region comprises a display region and a non-display region, the display control circuit is in the non-display region, and forming a transparent electrode layer on another side of the silicon wafer with the transparent cover plate as a substrate comprises:

removing all film layers on a side of the OLED display substrate away from the transparent cover plate and in the display region with the transparent cover plate as a substrate, to form at least one groove on the side of the OLED display substrate away from the transparent cover plate;

filling the at least one groove with a light-transmitting material; and forming the transparent electrode layer on the another side of the silicon wafer after the groove is filled.

According to still yet another aspect of the embodiments of the present disclosure, there is provided a display control method, applied to control the display in the embodiments of the present disclosure and comprising:

controlling an OLED display substrate in the display panel to operate and controlling an LCOS liquid crystal cell in the display panel to stop operation when a display instruction indicating a first display mode is received; and controlling the OLED display substrate to stop operation and controlling the LCOS liquid crystal cell to operate when a display instruction indicating a second display mode is received; wherein the first display mode and the second display mode are determined based on an ambient light brightness of environment in which the display panel is, and an ambient light brightness that the first display mode corresponds to is greater than an ambient light brightness that the second display mode corresponds to It is to be understood that both the foregoing general description and the following detailed description are exemplary only and are intended to limit the present disclosure.

BRIEF DESCRIPTION OF THE DRAWINGS

In order to describe the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

Figure 1:
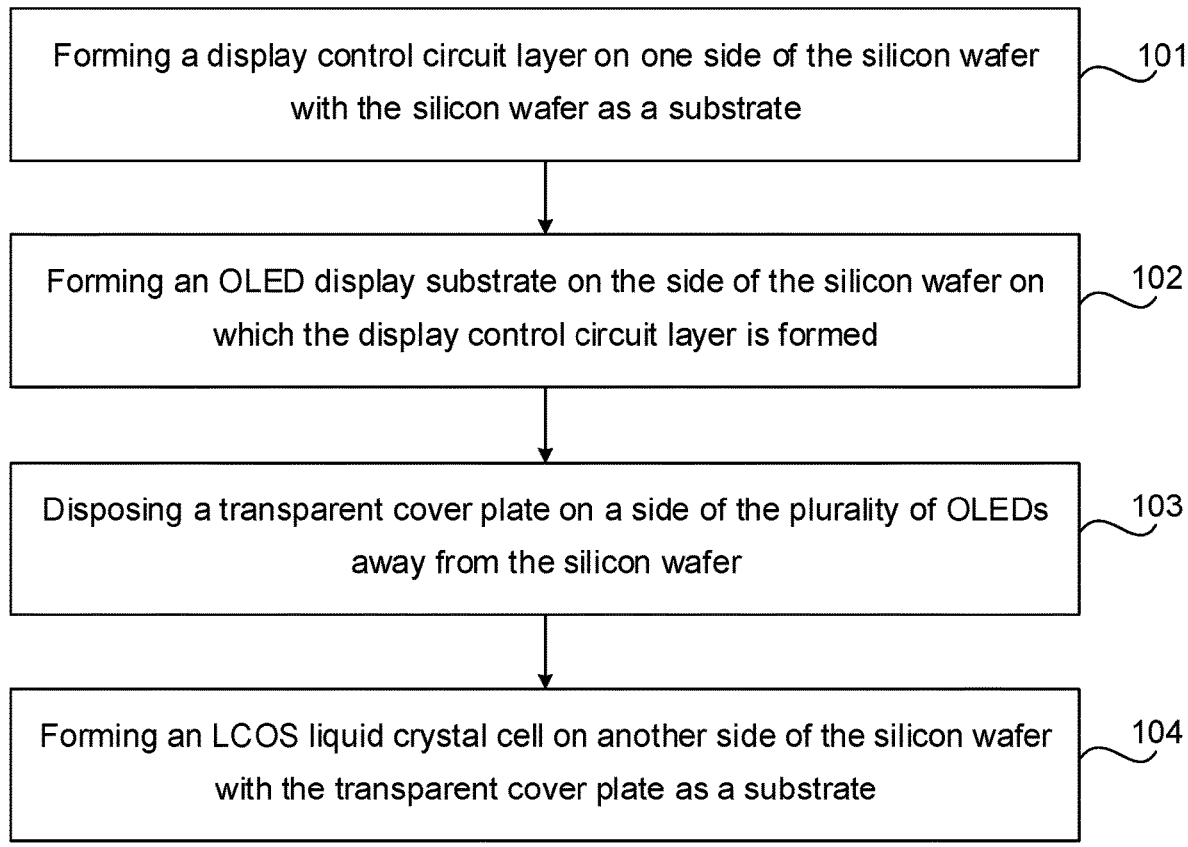
FIG. 1 is a flowchart of a method for manufacturing a display panel according to an embodiment of the present disclosure.

The accompanying drawings, which are incorporated in and constitute a part of this specification, illustrate embodiments consistent with the present disclosure, and together with the description, serve to explain the principles of the present disclosure.

DETAILED DESCRIPTION

The present disclosure will be described in further detail with reference to the accompanying drawings, to present the objects, technical solutions, and advantages of the present disclosure more clearly. Apparently, the embodiments described are merely some embodiments, rather than all embodiments, of the present disclosure. Based on the embodiments in the present disclosure, all other embodiments derived by persons or ordinary skill in the art without any creative efforts shall be within the protection scope of the present disclosure.

The display brightness of the existing OLED display panel is relatively low, and the display effect of the display panel is relatively poor in a high-brightness environment. Exemplarily, in the high-brightness environment, for example, under sunlight, the display brightness of the display panel needs to reach at least 5000 candelas per square meter ($cd/m^2$) such that the display panel can have a better display effect. However, the display brightness of the existing OLED display panel is generally 150 $cd/m^2$. Thus, the display panel has a relatively poor display effect in the high-brightness environment.

The embodiment of the present disclosure provides a display panel, including a silicon wafer, and a display control circuit layer, an OLED display substrate and a transparent cover plate which are sequentially laminated at a side of the silicon wafer, and a liquid crystal on silicon (LCOS) liquid crystal cell on another side of the silicon wafer. The OLED display substrate and the LCOS liquid crystal cell operate at different periods of time. The OLED display substrate includes a plurality of OLEDs. The LCOS liquid crystal cell includes a plurality of liquid crystal display units. The one side of the silicon wafer is opposite to another side of the silicon wafer. The display panel integrates the functions of the LCOS liquid crystal cell (also referred to as an LCOS display substrate) and the OLED display substrate (also referred to as a silicon-based OLED display substrate). The display effect is good in both high-brightness and low-brightness environments. For the convenience of understanding for readers, the following embodiments of the present disclosure briefly describe the working principles of the silicon-based OLED display substrate and the LCOS display substrate.

Firstly, the silicon-based OLED display substrate generally includes an anode layer, a light-emitting layer, and a cathode layer which are sequentially formed on the silicon wafer. When the silicon-based OLED display substrate operates, a voltage needs to be applied to the anode layer and the cathode layer, and light-emitting molecules of the light-emitting layer emit visible light under the action of an electric field, so that the silicon-based OLED display substrate normally displays.

Secondly, the LCOS display substrate generally includes a front light source, and a transparent electrode layer and a liquid crystal layer which are disposed on the silicon wafer. The transparent electrode layer includes a pixel electrode and a common electrode which are disposed in the same layer or in different layers. When the LCOS display substrate operates, the transparent electrode layer controls the liquid crystal in the liquid crystal layer to deflect, and the transparent electrode layer reflects the light irradiated by the front light source to the surface of the transparent electrode layer. When the reflected light passes through the liquid crystal layer, the liquid crystal in the liquid crystal layer has different deflection angles during operation, so that the transmittance of the reflected light is different. Therefore, the display substrate realizes display.

In the above two types of display substrates, for the silicon-based OLED display substrate, as the OLEDs therein are self-light emitting, the light-emitting brightness is relatively low. Therefore, silicon-based OLED display substrate has relatively poor display effect when the ambient light brightness is high, but the power consumption is low. For the LCOS display substrate, as a front light source is disposed, the light-emitting brightness is relatively high. Therefore, the LCOS display substrate has good display effect in the high-brightness environment, but the power consumption is high.

The embodiment of the present disclosure provides a method for manufacturing a display panel. The method is applied to manufacture the display panel provided in the embodiment of the present disclosure. As shown in FIG. 1, the method includes the following steps.

In step 101, with the silicon wafer as a substrate, a display control circuit layer is formed on one side of the silicon wafer.

The display control circuit layer includes: a plurality of display control circuits.

In step 102, an OLED display substrate is formed on the side of the silicon wafer on which the display control circuit layer is formed.

The OLED display substrate includes a plurality of OLEDs.

In step 103, a transparent cover plate is disposed on a side of the plurality of OLEDs away from the silicon wafer.

In step 104, an LCOS liquid crystal cell is formed on another side of the silicon wafer with the transparent cover plate as a substrate.

The LCOS liquid crystal cell includes a plurality of liquid crystal display units. The another side and the one side of the silicon substrate are opposite sides of the silicon substrate. The display control circuit includes: a first switching sub-circuit configured to control an operating state of the OLED, a second switching sub-circuit configured to control an operating state of the liquid crystal display unit, and a driving sub-circuit configured to control the operating states of the first switching sub-circuit and the second switching sub-circuit. The first switching sub-circuit and the second switching sub-circuit operate at different periods of time, that is, the working period of the first switching sub-circuit and the working period of the second switching sub-circuit are different, thereby enabling the OLED display substrate and the LCOS liquid crystal cell to operate at different periods of time, that is, the OLED display substrate and the LCOS liquid crystal cell do not operate in the same period.

In summary, according to the method for manufacturing a display panel provided in the embodiment of the present disclosure, the display control circuit layer, the OLED display substrate, and the transparent cover plate are formed on one side of the silicon wafer with the silicon wafer as a substrate, and the LCOS liquid crystal cell is formed on another side of the silicon wafer. The OLEDs in the OLED display substrate and the liquid crystal display units in the LCOS liquid crystal cell operate at different periods of time under control of the first switching sub-circuit and the second switching sub-circuit in the display control circuit, so that the OLED display substrate and the LCOS liquid crystal cell can be used targetedly in different usage environment, thereby ensuring that the display panel has a good display effect under different usage environments.

Figure 2:
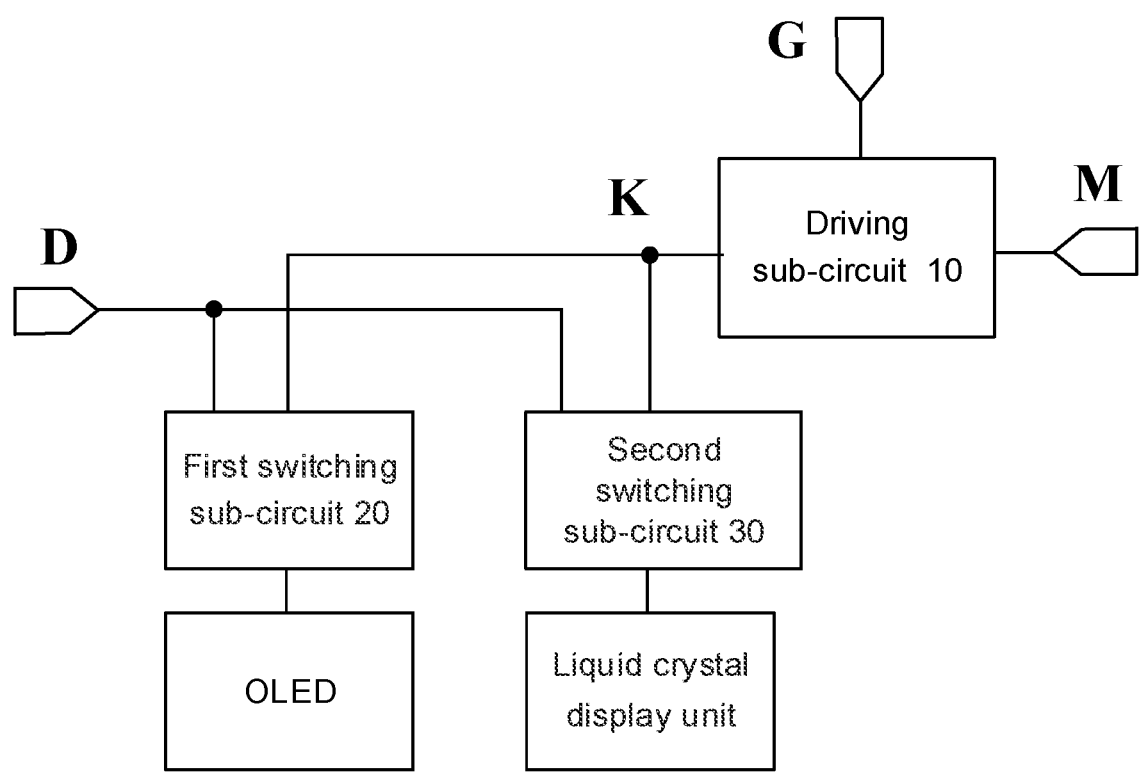
FIG. 2 is a schematic structural diagram of a display control circuit according to an embodiment of the present disclosure.

FIG. 2 is a schematic structural diagram of a display control circuit according to an embodiment of the present disclosure. As shown in FIG. 2, the display control circuit may include: a driving sub-circuit 10, a first switching sub-circuit 20, and a second switching sub-circuit 30.

The driving sub-circuit 10 is connected to a gate driving signal terminal G, a control signal terminal M and a control node K respectively and configured to provide a control signal from the control signal terminal M to the control node K under control of a gate driving signal from the gate driving signal terminal G.

The first switching sub-circuit 20 is connected to the control node K, a data signal terminal D, and an organic light emitting diode OLED in a display panel respectively, and configured to provide a data signal from the data signal terminal D to the OLED under control of the control node K.

The second switching sub-circuit 30 is configured to be connected to the control node K, the data signal terminal D, and the liquid crystal display unit in an LCOS liquid crystal cell respectively, and configured to provide the data signal to the liquid crystal display unit under control of the control node K. The first switching sub-circuit and the second switching sub-circuit operate at different periods of time.

Figure 3:
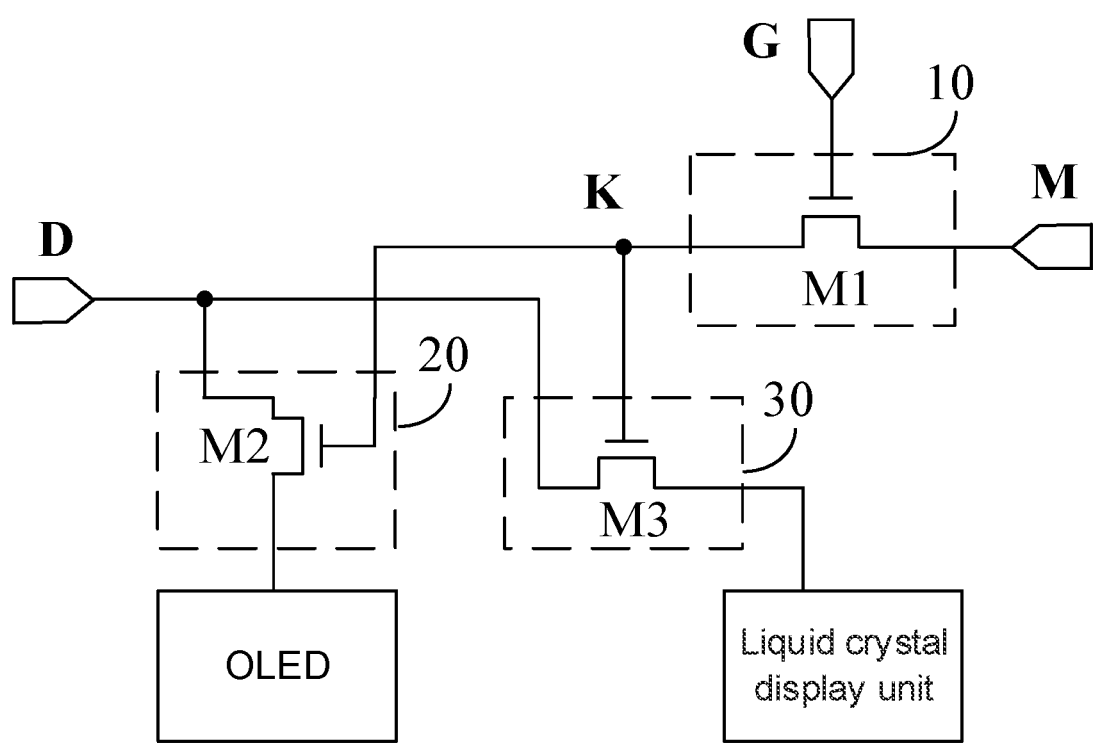
FIG. 3 is a schematic structural diagram of another display control circuit according to an embodiment of the present disclosure.

Optionally, as shown in FIG. 3, the driving sub-circuit 10 may include a driving transistor M1. The gate electrode of the driving transistor M1 is connected to the gate driving signal terminal G, the first electrode of the driving transistor M1 is connected to the control signal terminal M, and the second electrode of the driving transistor M1 is connected to the control node K. The first electrode may be one of a source electrode and a drain electrode, and the second electrode may be the other of the source electrode and the drain electrode.

Please continue referring to FIG. 3, the first switching sub-circuit 20 includes a first transistor M2. The gate electrode of the first transistor M2 is connected to the control node K, the first electrode of the first transistor M2 is connected to the data signal terminal D, and the second electrode of the first transistor M2 is connected to the OLED.

Please continue referring to FIG. 3, the second switching sub-circuit 30 includes a second transistor M3. The gate electrode of the second transistor M3 is connected to the control node K, the first electrode of the second transistor M3 is connected to the data signal terminal D, and the second electrode of the second transistor M3 is connected to the liquid crystal display unit. The polarities of the second transistor M3 and the first transistor M2 are opposite.

Optionally, a storage capacitor may be disposed between the second electrode of the driving transistor M1 and the data signal terminal D.

Optionally, the driving transistor M1, the first transistor M2, and the second transistor M3 may all be metal oxide semiconductor (MOS) transistors, that is, the driving transistor M1 may be a driving MOS transistor, the first transistor M2 may be a first MOS transistor, and the second transistor M3 may be a second MOS transistor.

In summary, the display control circuit provided in the embodiment of the present disclosure includes the first switching sub-circuit configured to provide the data signal to the OLED, and the second switching sub-circuit configured to provide the data signal to the liquid crystal display unit. Thus, the OLEDs in the OLED display substrate and the liquid crystal display units in the LCOS liquid crystal cell operate at different periods of time, and the OLED display substrate and the LCOS liquid crystal cell can be used targetedly in different usage environment, thereby ensuring that the display panel has a good display effect under different usage environment.

Correspondingly, the embodiments of the present disclosure further provides a method for driving a display control circuit. The method is applied to drive a display control circuit. Exemplarily, the method is applied to drive the display control circuit provided in the embodiments of the present disclosure, and the display control circuit includes: a driving sub-circuit, a first switching sub-circuit, and a second switching sub-circuit. The method includes the following steps.

A gate driving signal at a first potential and a first control signal at a first potential are controlled to be provided to the driving sub-circuit when a display instruction indicating; a first display mode is received. The driving sub-circuit provides the first control signal to the control node under control of the gate driving signal. The first switching sub-circuit provides a data signal from a data signal terminal to the OLED in a display panel under control of the control node.

A gate electrode driving signal at a first potential and a second control signal at a second potential are controlled to be provided to the driving sub-circuit when a display instruction indicating a second display mode is received. The driving sub-circuit provides the second control signal to the control node under control of the gate driving signal. The second switching sub-circuit provides the data signal to a liquid crystal display unit in the display panel under control of the control node.

The first display mode and the second display mode are determined based on the ambient light brightness of the environment where the display panel is, and the ambient light brightness that the first display mode corresponds to is greater than the ambient light brightness that the second display mode corresponds to.

In summary, according to the method for driving a display control circuit provided in the embodiments of the present disclosure, when the display instruction is received, signals are provided according to the mode indicated by the display instruction, to control the operating states of the OLED and the liquid crystal display unit at different periods of time through the first switching sub-circuit and the second switching sub-circuit, so that the OLED display substrate and the LCOS liquid crystal cell can be used targetedly in different usage environment, thereby ensuring that the display panel has a good display effect under different usage environment.

The display panel has a plurality of pixel regions. The pixel region is a region where pixels are, and each of the pixel regions includes at least two sub-pixel regions. Exemplarily, each of the pixel regions includes a red sub-pixel region, a green sub-pixel region, and a blue sub-pixel area.

Each sub-pixel region has an OLED, a liquid crystal display unit, and a display control circuit. Exemplarily, each sub-pixel region has one OLED, one liquid crystal display unit, one first MOS transistor configured to control an operating state of the OLED, one second MOS transistor for controlling an operating state of the liquid crystal display unit, and one driving MOS transistor for controlling the operating states of the first MOS transistor and the second MOS transistor. The first MOS transistor and the second MOS transistor are respectively one of an N-type MOS transistor and a P-type MOS transistor, that is, the polarities of the first MOS transistor and the second MOS transistor are opposite. The driving MOS transistor is one of the N-type MOS transistor and the P-type MOS transistor. The MOS transistor formed by a P-type substrate and two high-concentration n-diffusion regions is referred to as a P-type MOS transistor, and the MOS transistor formed by an N-type substrate and two high-concentration p-diffusion regions is referred to as an N-type MOS transistor.

Figure 4:
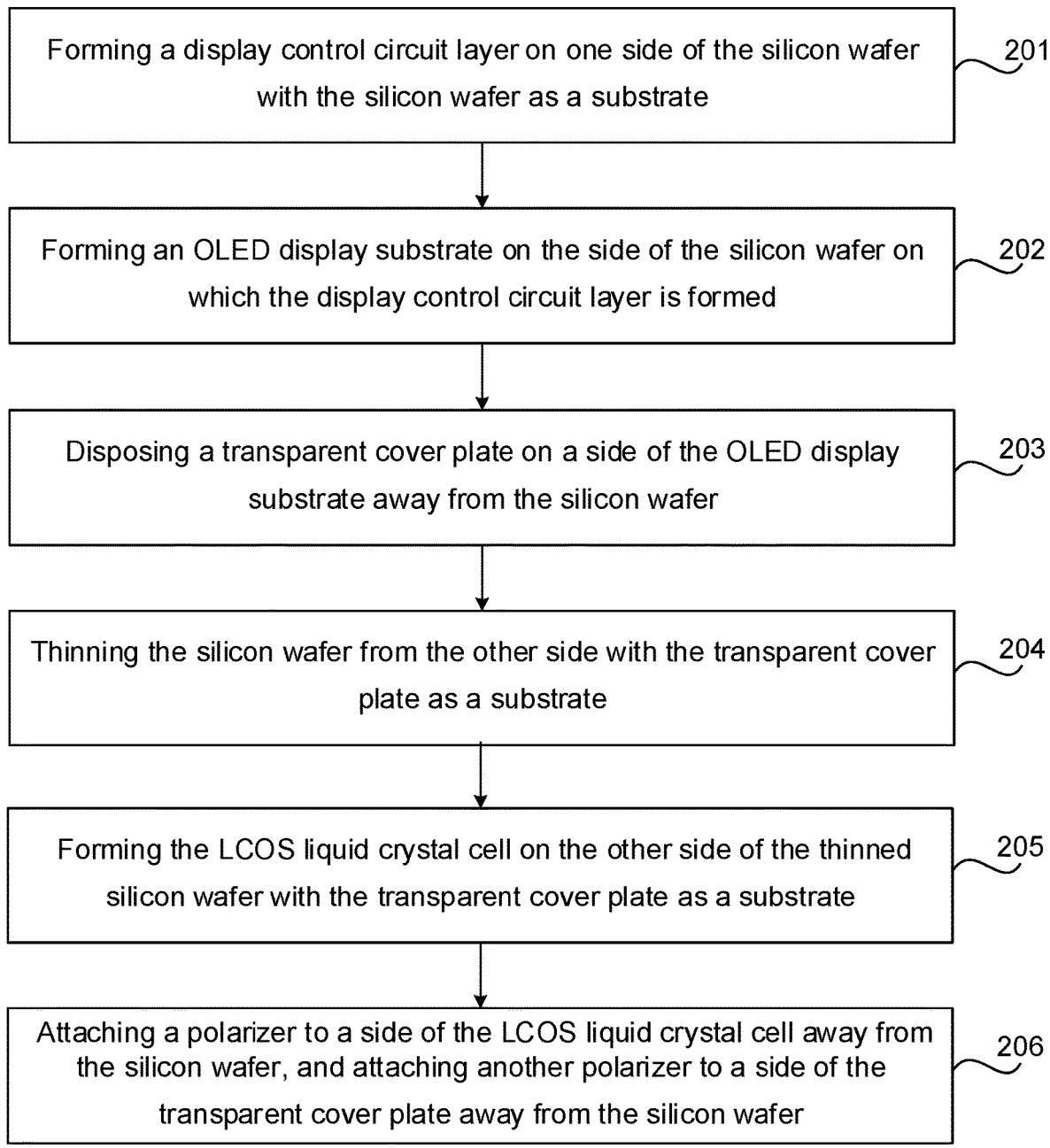
FIG. 4 is a flowchart of another method for manufacturing a display panel according to an embodiment of the present disclosure.

The method for manufacturing a display panel provided in the embodiments of the present disclosure is described detail by taking the display control circuit provided in the embodiments of the present disclosure as the display control circuit. As shown in FIG. 4, the method for manufacturing a display panel includes the following steps.

In step 201, a display control circuit layer is formed on one side of the silicon wafer with the silicon wafer as a substrate.

The display control circuit layer may include a plurality of display control circuits. The display control circuit may include: a driving sub-circuit, a first switching sub-circuit, and a second switching sub-circuit. The driving sub-circuit includes a driving transistor, the first switching sub-circuit includes a first transistor, and the second switching sub-circuit includes a second transistor. In this case, the process of forming a display control circuit layer on one side of the silicon wafer with the silicon wafer as a substrate may include: forming a plurality of driving transistors, a plurality of first transistors and a plurality of second transistors on one side of the silicon wafer with the silicon wafer as a substrate.

Optionally, the process of forming a plurality of driving transistors, a plurality of first transistors, and a plurality of second transistors may include the following steps.

In step A1, ion implantation is performed on the silicon wafer by a first ion implantation process, to obtain Q ion implantation regions in each sub-pixel region of the silicon wafer. The implanted ions in at least two ion implantation regions in each of the sub-pixel regions have opposite polarities.

Q is the total number of the transistors in the sub-pixel region. That is, in the case where Q transistors need to be disposed in any sub-pixel region, Q ion implantation regions need to be formed in step A1, and each ion implantation region corresponds to one transistor. Exemplarily, when the display control circuit in each sub-pixel region includes: one driving transistor, one first transistor and one second transistor, each sub-pixel region includes three transistors, then in step A1, three ion implantation regions needs to be formed in each sub-pixel region. Hereinafter, the method for manufacturing a display panel is described by taking an example in which each sub-pixel region includes one driving transistor, one first transistor, and one second transistor.

Since the first transistor and the second transistor have opposite polarities, when three ion implantation regions are formed, twice ion implantation processes need to be adopted to form the three ion implantation regions in each sub-pixel region of the silicon wafer. The three ion implantation regions may include two P-well regions and one N-well region. Alternatively, the three ion implantation regions include two N-well regions and one P-well region.

Exemplarily, the process of forming the ion implantation regions by twice ion implantation processes may include the following steps.

In step A11, a first photoresist pattern is formed on the silicon wafer. The first photoresist pattern exposes a first region on the silicon wafer.

Exemplarily, a first photoresist layer may be formed on the silicon wafer by a coating process, and then the first photoresist layer is processed by a photoetching process to obtain the first photoresist pattern. The photoetching process includes exposure and developing. The first region subjected to the first ion implantation may be one of the P-well region and the N-well region.

In step A12, first ion implantation is performed on the first region with the first photoresist pattern as a mask.

In step A13, after the first photoresist pattern is stripped off, a second photoresist pattern is formed on the silicon wafer. The second photoresist pattern exposes a second region on the silicon wafer.

Exemplarily, after the first photoresist pattern is stripped off, a second photoresist layer may be formed on the silicon wafer by a coating process, and then the second photoresist layer is processed by a photoetching process to obtain the second photoresist pattern. The photoetching process includes exposure and developing. The second region does not overlap with the first region, and the second region subjected to the first ion implantation may be the other of the P-well region and the N-well region.

In step A14, with the second photoresist pattern as a mask, second ion implantation is performed on the silicon wafer.

In step A15, after the second photoresist pattern is stripped off, the silicon wafer subjected to the twice ion implantations is annealed.

Exemplarily, the annealing may be performed in N2 (nitrogen) environment. The annealing temperature may be in the range of 600-800° C. (Celsius degree). The annealing process can repair the damage to the silicon substrate during the twice ion implantation processes (for example, eliminating lattice defects in the silicon substrate), and activate the implanted ions.

Figure 5:
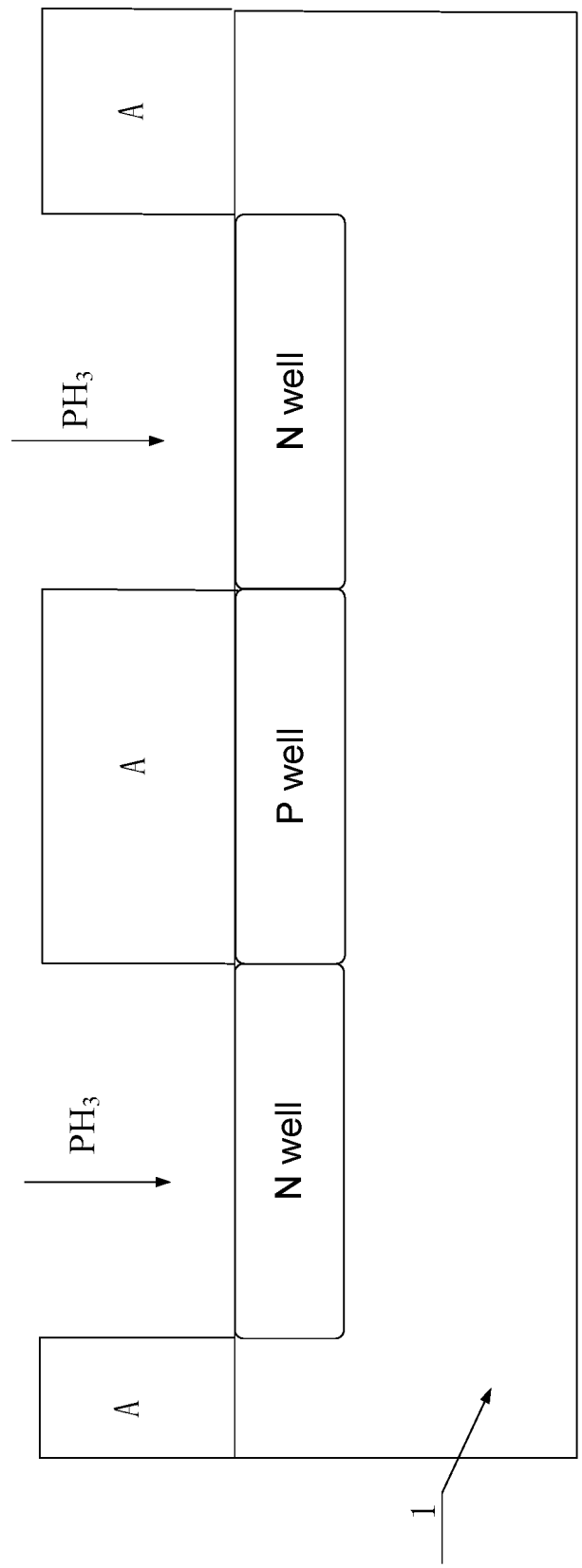
FIG. 5 is a manufacturing process diagram of a display panel according to an embodiment of the present disclosure.

It is assumed that the first MOS transistor is a P-type MOS transistor, the second MOS transistor is an N-type MOS transistor, and the driving MOS transistor is an N-type MOS transistor, then three ion implantation regions formed in any sub-pixel region on the silicon wafer include two N-well regions and one P-well region. Further, it is assumed that the first ion implantation in step A12 is N-well implantation, and the second ion implantation in step A14 is P-well implantation, then the implementation process of the above step A12 may be made reference to FIG. 5. The first photoresist pattern A on the silicon wafer 1 shields the portion other than the first region and exposes the first region, and then N-well implantation is performed on the first region with the first photoresist pattern A as a mask. Exemplarily, the N-well implantation may be performed by using PH3 (phosphine) ions, and the implantation energy ranges from 10 keV to 50 keV (in kiloelectron volt), and the implantation depth ranges from 0.8 μm (micrometer) to 2 μm. The portion other than the first region includes a second region and other regions (i.e., the regions other than the first region and the second region).

Figure 6:
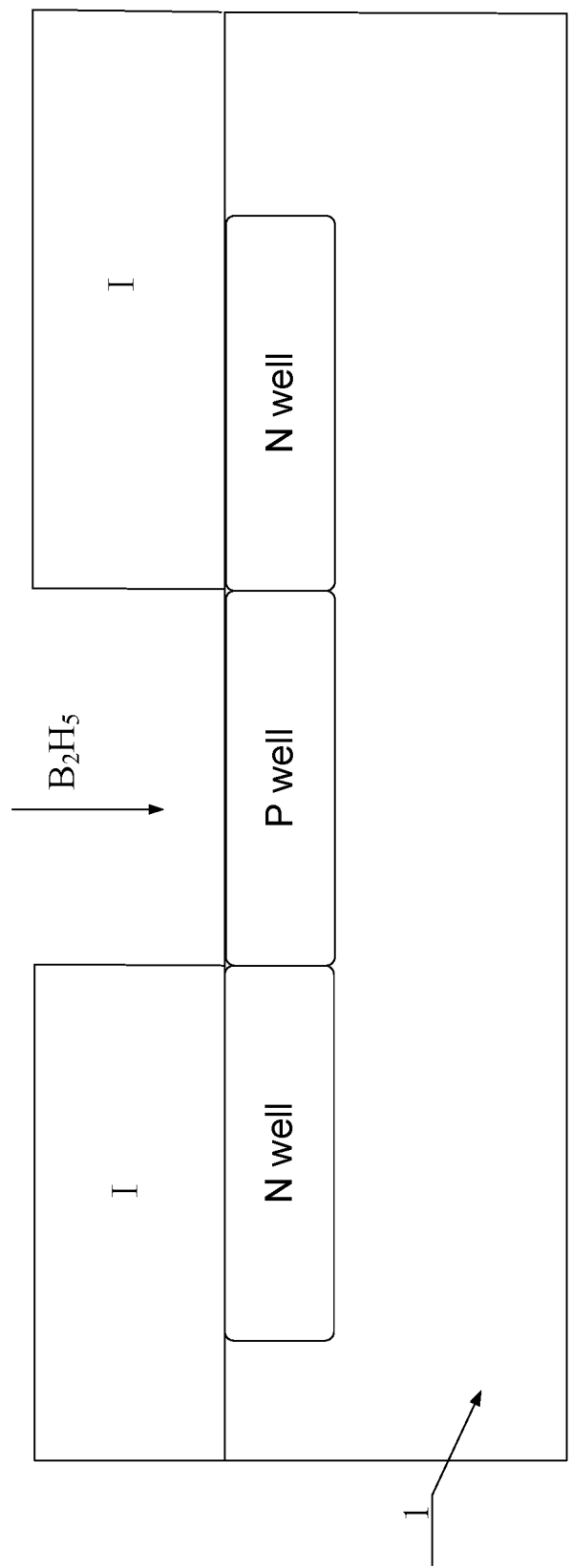
FIG. 6 is a manufacturing process diagram of another display panel according to an embodiment of the present disclosure.

The implementation process of the above step A14 may be made reference to FIG. 6. The second photoresist pattern I on the silicon wafer 1 shields the portion other than the second region, and exposes the second region, and then P-well implantation is performed on the second region with the second photoresist pattern I as a mask. Exemplarily, the P-well implantation may be performed by using B2H5 (boron hydride) ions, the implantation energy ranges from 20 keV to 80 keV (kiloelectron volt), and the implantation depth ranges from 0.8 µm to 2 µm. Besides, the P-well implantation depth may be the same as the N-well implantation depth. The portion other than the second region includes the first region and other regions (i.e., the regions other than the first region and the second region).

In step A2, a gate insulating layer is formed on the side of the silicon wafer on which the ion implantation regions are formed.

Exemplarily, the gate insulating layer may be formed on the side of the silicon wafer on which the ion implantation regions are formed by deposition, coating, or sputtering. Optionally, the material of the gate insulating layer may be silicon oxide.

In step A3, a gate electrode pattern is formed on the side of the gate insulating layer away from the silicon wafer. The gate electrode pattern includes a plurality of gate electrodes, and the orthographic projection of each gate electrode on the silicon wafer is within one ion implantation region.

The plurality of gate electrodes and the plurality of transistors may be in one-to-one correspondence. Optionally, the gate electrode layer may be formed on the side of the gate insulating layer away from the silicon wafer by deposition, coating or sputtering, and then the gate electrode layer is patterned to form the gate electrode pattern.

Exemplarily, the material of the gate electrode pattern may be polysilicon. The process of forming the gate electrode pattern may include the following steps. A polysilicon layer is deposited on the side of the gate insulating layer away from the silicon wafer by a low pressure chemical vapor deposition process, and doping the polysilicon layer, for example, doping boron, to form the gate electrode layer. Then, the gate electrode layer is processed by a single patterning process to obtain the gate electrode pattern. The singe patterning process includes photoresist coating, exposure, developing, etching, and photoresist stripping. The exposure process may be implemented with a deep ultraviolet photoetching technology, and the etching process may be implemented with an inductive coupled plasma (ICP) technology.

Figure 7:
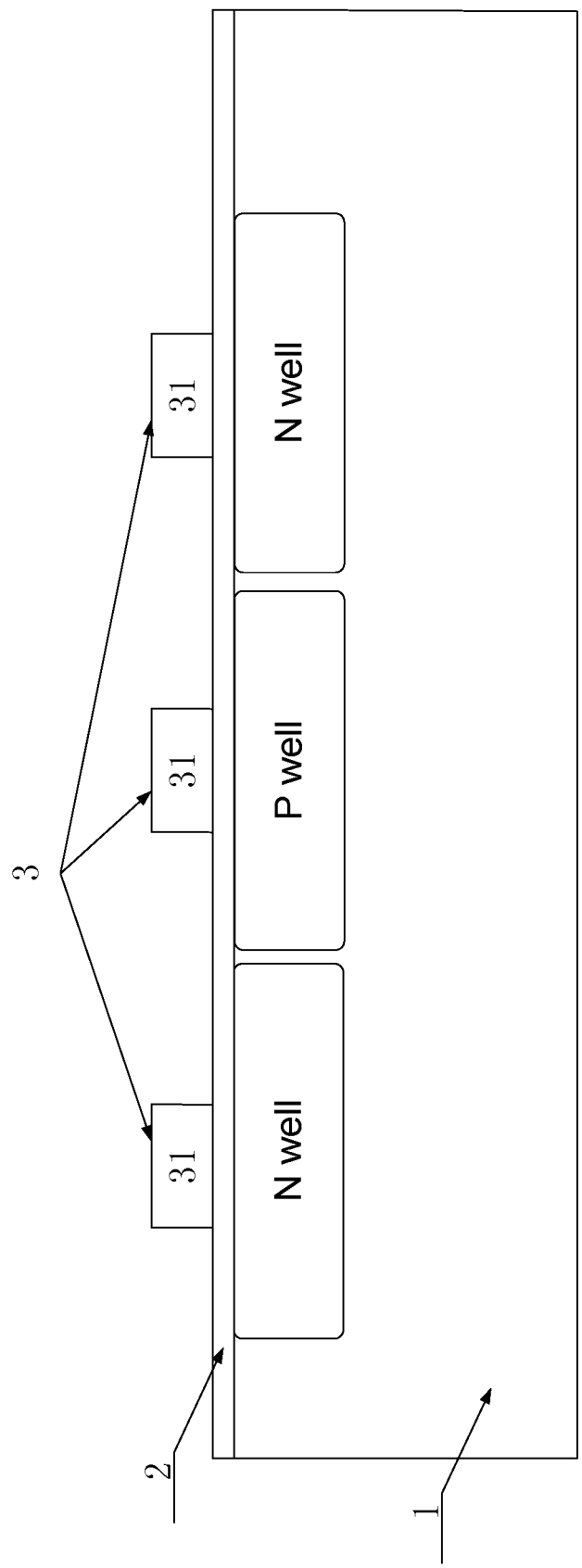
FIG. 7 is a schematic structural diagram of a display panel according to an embodiment of the present disclosure.

As shown in FIG. 7, which is a schematic structural diagram of a silicon wafer 1 formed with the gate electrode pattern. The gate electrode pattern 3 includes a plurality of gate electrodes 31 arranged at intervals. The length direction of each gate electrode 31 is perpendicular to the width direction of the silicon wafer 1 (i.e., the row direction of the formed display panel). As shown in FIG. 7, the length direction of each of the gate electrodes 31 is perpendicular to the paper.

In step A4, a source-drain electrode pattern and an active pattern are formed in each ion implantation region of the silicon wafer by a second ion implantation process.

The portion, in which ions are implanted by the second ion implantation process, of the ion implantation region is the source-drain electrode pattern, and the portion, in which the ions are not implanted by the second ion implantation process, of the ion implantation region is the active pattern. The implanted ions in the source-drain electrode pattern and the implanted ions in the active pattern in the same ion implantation region have opposite polarities. The source-drain electrode pattern includes a source electrode and a drain electrode, and the orthographic projection of each gate electrode on the silicon wafer is between the source electrode and the drain electrode in one ion implantation region. The plurality of source-drain electrode patterns formed on the silicon wafer may be in one-to-one correspondence with the plurality of gate electrodes in the gate electrode pattern.

It should be noted that the implementation process of step A4 may be made reference to the implementation process of the above step A1. Exemplarily, the implementation process may include following steps. A third photoresist pattern is formed on the silicon wafer. The third photoresist pattern exposes a third region on the silicon wafer. The first ion implantation is performed in the third region with the third photoresist pattern as a mask. After the third photoresist pattern is stripped off, a fourth photoresist pattern is formed on the silicon wafer. The fourth photoresist pattern exposes a fourth region on the silicon wafer. The second ion implantation is performed on the silicon wafer with the fourth photoresist pattern as a mask. After the fourth photoresist pattern is stripped off, the silicon wafer subjected to the twice ion implantations is annealed. Here, the third region subjected to the second ion implantation may be one of the P-well region and the N-well region, and the fourth region subjected to the second ion implantation may be the other of the P-well region and the N-well region.

Figure 8:
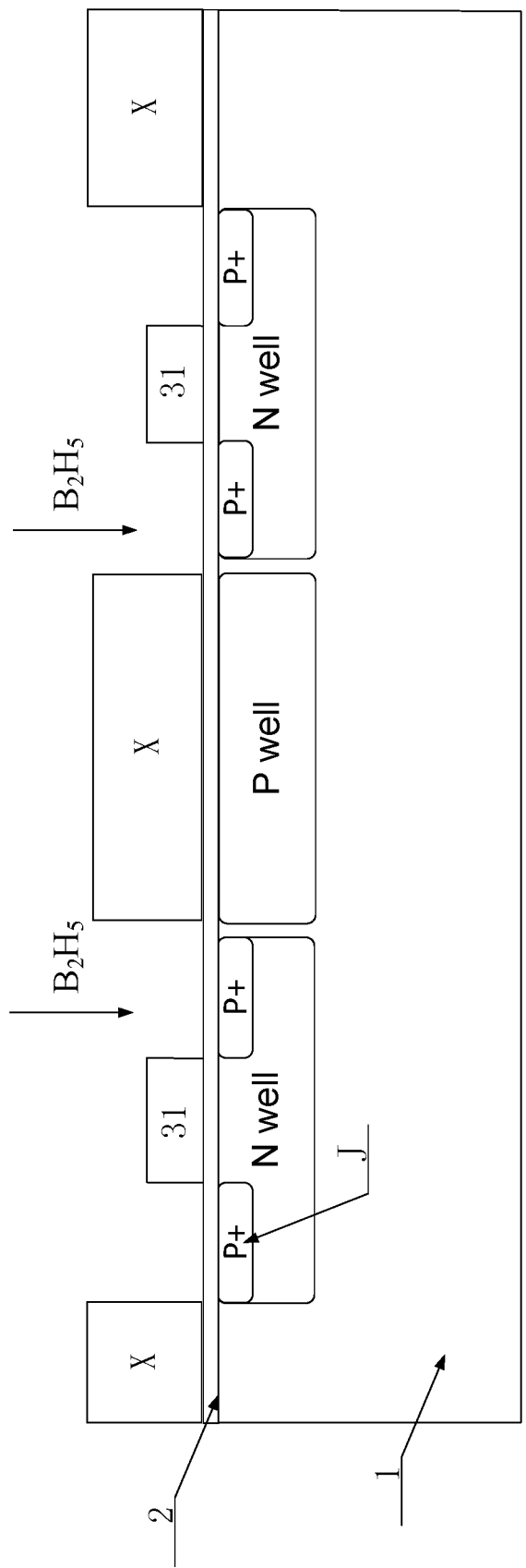
FIG. 8 is a manufacturing process diagram of yet another display panel according to an embodiment of the present disclosure.

It is assumed that the first ion implantation in step A4 is a source-drain implantation in the N-well region, and the second ion implantation is a source-drain implantation in the P-well region, then process of the source-drain implantation in the N-well region may be made reference to FIG. 8. The third photoresist pattern X on the silicon wafer 1 shields the portion other than the third region, and exposes the third region. With the third photoresist pattern X and the gate electrode 31 as a mask, the source-drain implantation is performed in the third region to form a source-drain electrode pattern J. Exemplarily, the source-drain implantation may be performed in the third region by using B2H5 (boron hydride) ions. The implantation dose is 105-106e (electron), the implantation energy is 5 keV-10 keV (kiloelectron volt), and the implantation depth is 0.08 µm-0.2 µm (micrometer). The third region and the first region may be the same region.

Figure 9:
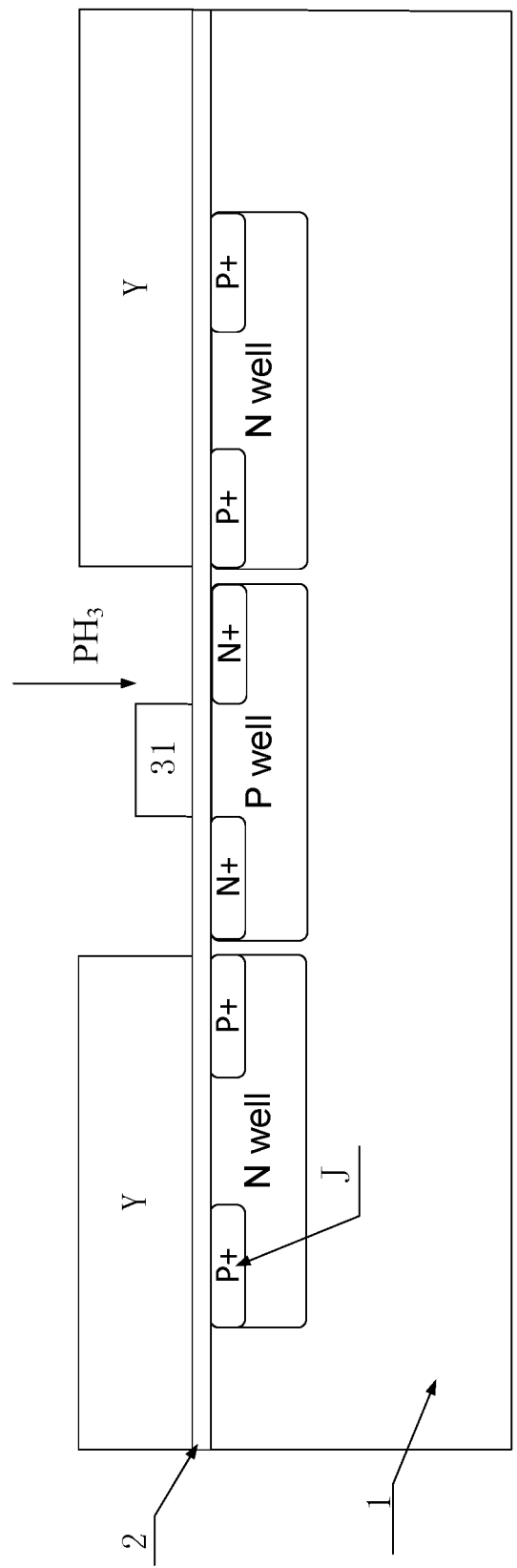
FIG. 9 is a manufacturing process diagram of still yet another display panel according to an embodiment of the present disclosure.

The process of the source-drain implantation in the P-well region may be made reference to FIG. 9. The fourth photoresist pattern Y on the silicon wafer 1 shields the portion other than the fourth region, and exposes the fourth region. With the fourth photoresist pattern Y and the gate electrode 31 as a mask, the source-drain implantation is performed in the fourth region to form the source-drain electrode pattern J. Exemplarily, the source-drain implantation may be performed in the P-well region by using PH3 (phosphine) ions. The implantation dose is 105-106e (electron), the implantation energy is 8 keV-20 kev (kiloelectron volt), and the implantation depth is 0.08 µm-0.2 µm (micrometer). The fourth region and the second region may be the same region.

It should be noted that the Q transistors in each sub-pixel region need to be insulated from each other to ensure no interference between each other. In an optional implementation, when step A1 is performed, every two ion implantation regions formed in each sub-pixel region may be spaced apart from each other to insulate the formed transistors from each other. The structure of the formed transistor may be the structure of the transistor in the middle of the three transistors shown in FIG. 9. In another optional implementation, before the above step A3 is performed, an isolation groove may be formed between every two ion implantation regions to insulate the formed ion implantation regions.

Figure 10:
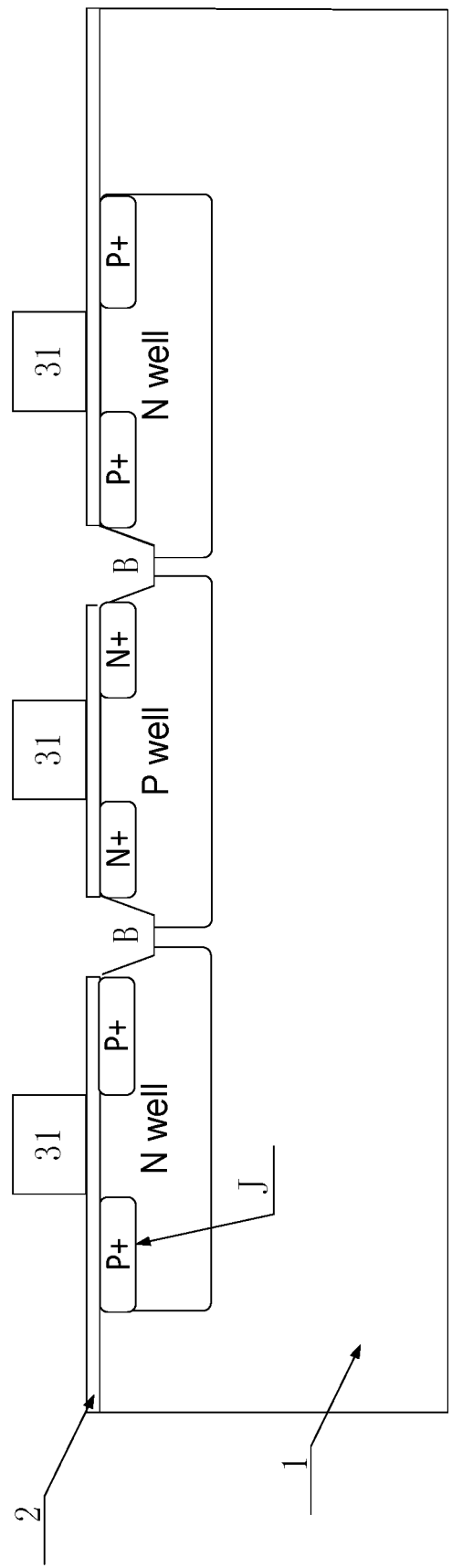
FIG. 10 is a schematic structural diagram of another display panel according to an embodiment of the present disclosure.

The process of forming the isolation grooves may include following steps. A mask pattern is formed on the gate insulating layer. The mask pattern exposes a region where the isolation grooves are to be disposed. The region where the isolation grooves are to be disposed is etched by the mask pattern to form the isolation grooves and then the mask pattern is stripped off. The silicon wafer 1 in which the isolation grooves B are formed may be as shown in FIG. 10. There is one isolation groove B between every two adjacent ion implantation regions. Exemplarily, the material of the mask pattern may be silicon nitride.

When insulation among the transistors is achieved by the isolation grooves, the above step A3 may include forming a gate electrode pattern on the side, away from the silicon wafer, of the gate insulating layer on which the isolation grooves are formed. It should be noted that in order to reduce the step difference (i.e., the height difference) among the film layers on the formed transistor, planarization may be performed on the silicon wafer before the gate electrode pattern is formed.

In an optional implementation, the planarization process may include following steps. Firstly, the isolation grooves are filled with oxide, and then an oxide film layer is formed on the silicon wafer filled with oxide by a coating, deposition or sputtering process. For example, an oxide film layer is formed by a CVD process. Afterwards, planarization is performed on the oxide film layer by a chemical or mechanical polishing process to obtain a third planarization layer (also referred to as a planarized layer).

Figure 11:
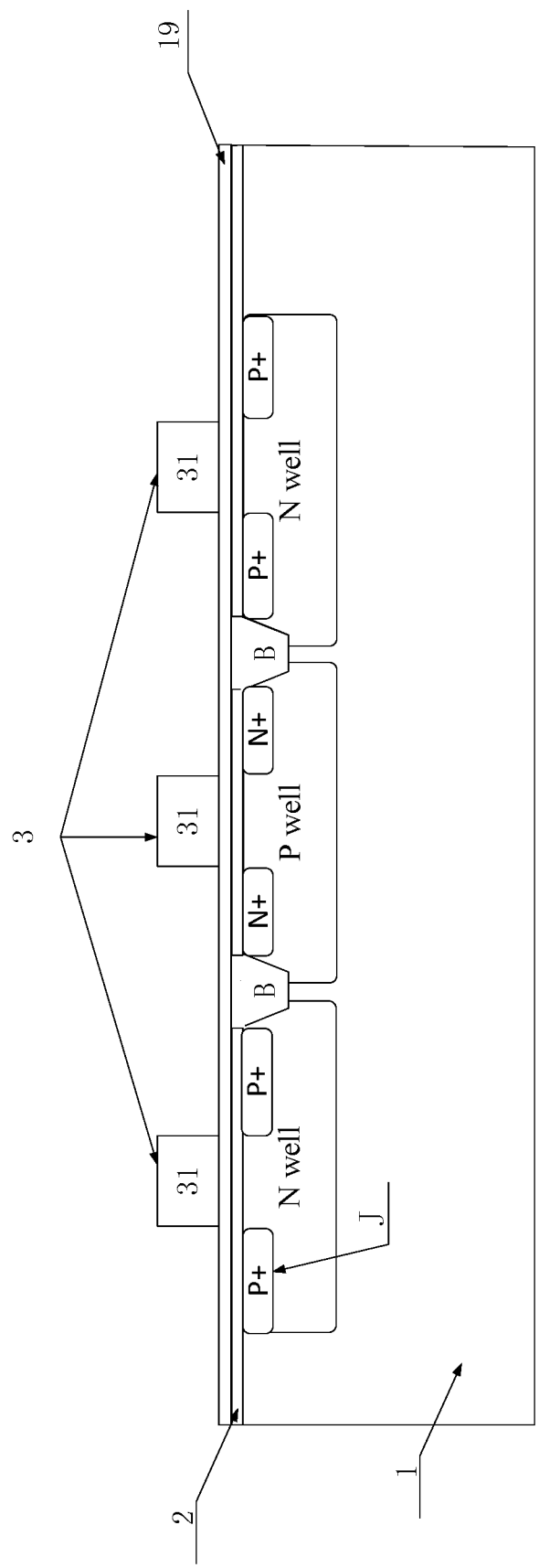
FIG. 11 is a schematic structural diagram of yet another display panel according to an embodiment of the present disclosure.

In another optional implementation, the planarization process may include following steps. An oxide film layer is formed on the gate insulating layer by a coating, deposition or sputtering process. For example, an oxide film layer is formed by a CVD process. Then, planarization is performed on the oxide film layer by using a chemical or mechanical polishing process to obtain a third planarization layer. The material of the oxide may be silicon oxide or aluminum oxide. As shown in FIG. 11, which is a schematic structural diagram of another silicon wafer formed with a transistor, A gate insulating layer 2, isolation grooves B, a third planarization layer 19, and a gate electrode pattern 31 are on the silicon wafer 1, and an active pattern and a source-drain electrode pattern J are formed on the silicon wafer 1 by ion implantation.

So far, a plurality of transistors is formed in each sub-pixel region of the silicon wafer, and then the OLED display substrate and the LCOS liquid crystal cell may be respectively formed on both sides of the silicon wafer. However, in order to ensure that the manufactured display panel can work normally, the plurality of transistors needs to be electrically connected to the corresponding display units, that is, the first transistor is electrically connected to the corresponding OLED, the second transistor is electrically connected to the corresponding liquid crystal display unit, and each transistor is connected to a corresponding signal terminal. Correspondingly, before the OLED display substrate and the LCOS liquid crystal cell are formed, a conductive pattern for realizing electrical connection may be formed at first. Besides, in order to reduce the step difference of respective film layers in the display panel, a planarization layer may be formed on each of both sides of the conductive pattern. Therefore, the process of forming the display control circuit layer on one side of the silicon wafer with the silicon wafer as a substrate may further include the following steps.

In step B1, a first planarization layer is formed on the side of the silicon wafer on which the plurality of driving transistors, the plurality of first transistors, and the plurality of second transistors are formed.

Exemplarily, after the source-drain electrode is formed, a coating, deposition or sputtering process, for example, a CVD process may be adopted to deposit a first planarization layer material on a side of the gate electrode pattern away from the silicon wafer, then the deposited first planarization layer material is planarized by a chemical or mechanical polishing process to obtain the first planarization layer. The first planarization layer can ensure smoothness of the film layers to reduce the step difference of the film layers. The material of the first planarization layer may be an insulating material such as silicon oxide or aluminum oxide.

In step B2, a conductive pattern is formed on a side of the first planarization layer away from the silicon wafer. The conductive pattern includes a first sub-pattern and a second sub-pattern which are insulated from each other in each sub-pixel region, the first sub-pattern is connected to the gate electrode of the first transistor, the gate electrode of the second transistor, and the first electrode of the driving transistor in the sub-pixel region where the first sub-pattern is respectively, and the second sub-pattern is connected to the first electrode of the second transistor in the pixel region where the second sub-pattern is located.

A via hole may be formed in the first planarization layer firstly, for example, the via hole is formed in the first planarization layer by using a single patterning process. The patterning process may include: photoresist coating, exposing, developing, etching, and photoresist peeling. The etching process may be an ICP etching process. Then, the conductive pattern is formed on a side of the first planarization layer provided with the via hole away from the silicon wafer. The first sub-pattern may be connected to the gate electrode of the first transistor, the gate electrode of the second transistor and the first electrode of the driving transistor in the sub-pixel region where the first sub-pattern is by the three via holes respectively. The second sub-pattern is connected to the first electrode of the second transistor in the sub-pixel region where the second sub-pattern is located by the via hole. The material of the conductive pattern may be titanium metal (Ti).

In step B3, a second planarization layer is formed on a side of the conductive pattern away from the silicon wafer.

Exemplarily, a second planarization layer material may be deposited on a side of the conductive pattern away from the silicon wafer by a coating, deposition or sputtering process, for example, a CVD process. Then the planarization layer material is planarized by a deposition of a chemical or mechanical polishing process to form the second planarization layer. The material of the second planarization layer may be an insulating material such as silicon oxide or aluminum oxide.

Figure 12:
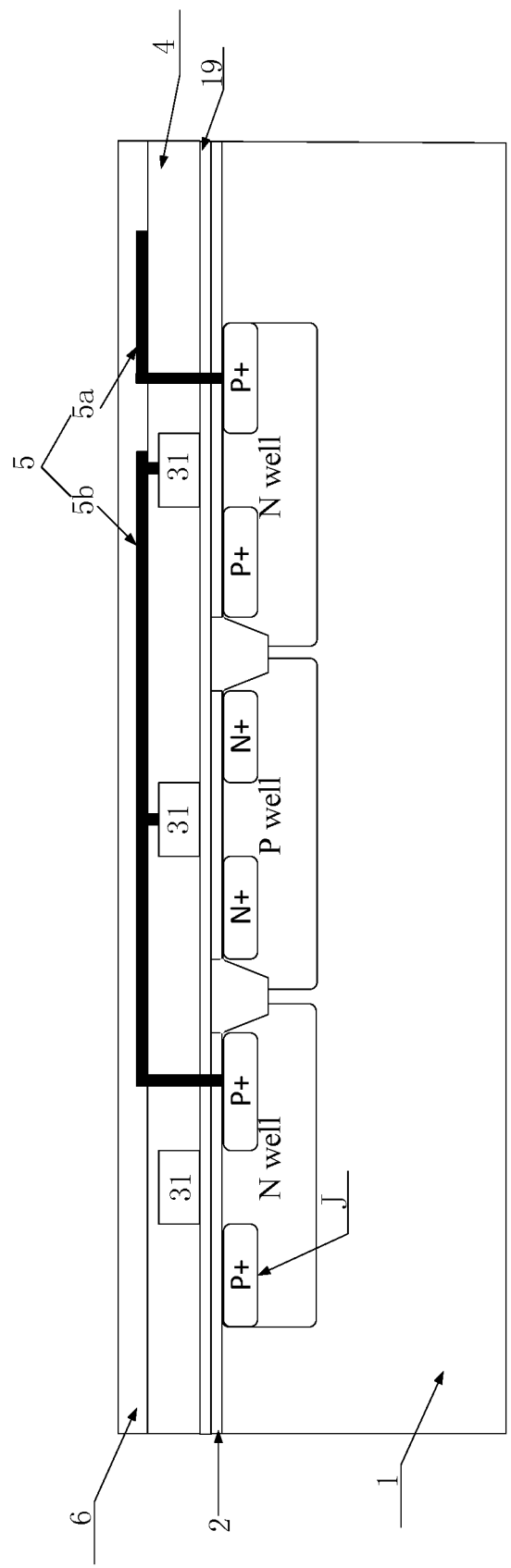
FIG. 12 is a schematic structural diagram of still yet another display panel according to an embodiment of the present disclosure.

As shown in FIG. 12, which is a schematic view that the first planarization layer 4, the conductive pattern 5, and the second planarization layer 6 are formed on the silicon wafer shown in FIG. 11. The conductive pattern 5 includes a first sub-pattern 5a and a second sub-pattern 5b. The first sub-pattern 5a is connected to the gate electrode of the first transistor, the gate electrode of the second transistor and the first electrode of the driving transistor in the sub-pixel region where the first sub-pattern 5a is located by the three via holes respectively. The second sub-pattern 5b is connected to the first electrode of the second transistor in the sub-pixel region where the second sub-pattern 5b is located by the via hole.

In step 202, an OLED display substrate is formed on the side of the silicon wafer on which the display control circuit layer is formed.

A first electrode layer, a self-light-emitting layer, and a second electrode layer may be sequentially formed on a side of the second planarization layer away from the silicon wafer to obtain the OLED display substrate. The OLED display substrate includes a plurality of OLEDs. The first electrode layer may be one of a cathode layer and an anode layer, and the second electrode layer may be the other of the cathode layer and the anode layer. The first electrode layer includes a plurality of first electrode blocks, and each of the first electrode blocks may be connected to the output terminal of one first switching sub-circuit. Exemplarily, the first electrode block of the same sub-pixel is connected to a second electrode of the first transistor.

Exemplarily, it is assumed that the first electrode layer is the anode layer and the second electrode layer is the cathode layer, the process of forming the OLED display substrate includes: forming a via hole in the second planarization layer, the bottom of the via hole being in contact with the second electrode contact of the first MOS transistor, and then sequentially forming the anode layer, the self-light-emitting layer and the cathode layer on a side of the second planarization layer provided with the via hole away from the silicon wafer. The anode layer includes a plurality of anodes respectively disposed in the plurality of sub-pixel regions, and the anodes are connected to the second electrode of the first MOS transistor by the via hole. Both the cathode layer and the anode layer may be made of a transparent conductive material, such as indium tin oxide (ITO).

Optionally, after the OLED display substrate is formed, the OLED display substrate may be subjected to thin film encapsulation, that is, a thin film encapsulation layer is formed on a side of the OLED display substrate away from the silicon wafer to block water and oxygen. Exemplarily, the OLED display substrate may be subjected to thin film encapsulation by a plasma enhanced chemical vapor deposition device. Exemplarily, an organic layer and an inorganic layer may be alternately deposited on a side of the OLED display substrate away from the silicon wafer to perform thin film encapsulation on the OLED display substrate. The organic layer can block water content, and the inorganic layer can block oxygen. Optionally, the inorganic layer may be a silicon nitride layer.

Figure 13:
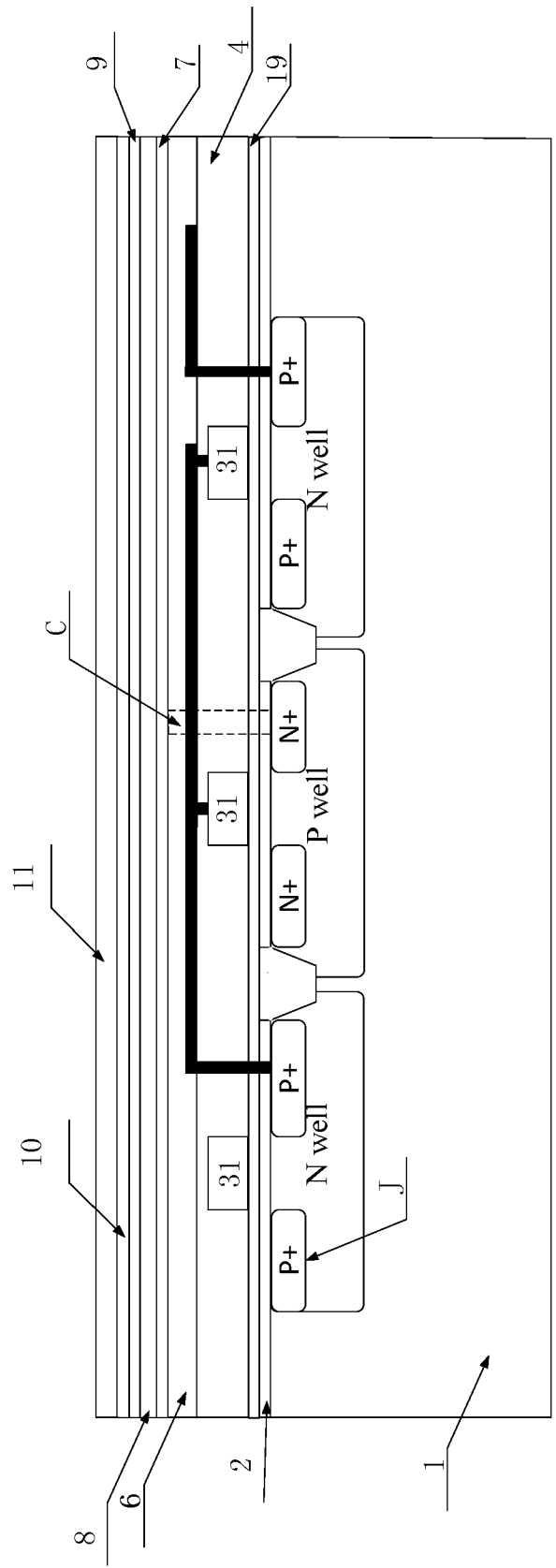
FIG. 13 is a schematic structural diagram of a display panel according to an embodiment of the present disclosure.

As shown in FIG. 13, which is a schematic view that the anode layer 7, the self-light-emitting layer 8, the cathode layer 9, and the thin film encapsulation layer 10 are sequentially formed on a side of the second planarization layer 6 away from the silicon wafer 1 shown in FIG. 12. One certain anode of the anode layer 7 is connected to the second electrode of the first transistor by the via hole C.

In step 203, a transparent cover plate is disposed on a side of the OLED display substrate away from the silicon wafer.

The transparent cover plate can block the water and oxygen to a greater extent, and can protect the film layer located on a side of the transparent cover plate close to the silicon wafer. Therefore, the quality and service life of the manufactured display panel can be ensured to a greater extent by disposing the transparent cover plate. Exemplarily, the transparent cover plate may be a rigid plate, for example, the transparent cover plate may be made of glass or quartz or the like. Exemplarily, a schematic structural view of the silicon wafer 1 having the transparent cover plate 11 may refer to FIG. 13.

In step 204, with the transparent cover plate as a substrate, the silicon wafer is thinned from the other side.

In the embodiment of the present disclosure, after the OLED is prepared, the other side of the silicon wafer may be thinned with the transparent cover plate as a substrate to facilitate thinning of the display panel. Exemplarily, the silicon wafer may be thinned to 5 μm, and the thinning treatment may include: grinding treatment, polishing treatment, and etching treatment which are sequentially performed. Therefore, the extraction of the leads in the display panel is facilitated while the thickness and weight of the finished display panel are greatly reduced.

In step 205, with the transparent cover plate as a substrate, the LCOS liquid crystal cell is formed on the other side of the thinned silicon wafer.

In the embodiment of the present disclosure, the LCOS liquid crystal cell is formed on the other side of the thinned silicon wafer with the transparent cover plate as a substrate. The LCOS liquid crystal cell includes a plurality of liquid crystal display units, and each of the liquid crystal display units is configured to reflect light of one color.

The LCOS liquid crystal cell may have various structures, for example, the LCOS liquid crystal cell includes a pixel electrode and a common electrode which are oppositely disposed, and a liquid crystal layer between the pixel electrode and the common electrode. For another example, the LCOS liquid crystal cell includes a transparent electrode and a transparent substrate which are oppositely disposed, and a liquid crystal layer between the transparent electrode and the transparent substrate. The transparent electrode may include a pixel electrode and a common electrode disposed in the same layer or in different layers.

The embodiment of the present disclosure illustrates the above forming process of the LCOS liquid crystal cell by taking the fact that the LCOS liquid crystal cell includes the transparent electrode, the transparent substrate, and the liquid crystal layer as an example. The process includes the following steps.

In step C1, with the transparent cover plate as a substrate, a transparent electrode layer is formed on the other side of the thinned silicon wafer. The transparent electrode layer includes a plurality of transparent electrodes, and the transparent electrodes are connected to the output terminal of the second switching sub-circuit by via holes.

In the embodiment of the present disclosure, in the formed display panel, the LCOS liquid crystal cell and the OLED display substrate are respectively located on two sides of the silicon wafer. During image display of the LCOS liquid crystal cell, a light source disposed outside is required to provide light. Therefore, in order to ensure effective display of the image by the LCOS liquid crystal cell and reduce the blocking of the light provided by the external light source by the OLED, the display surface (also referred to as the light emergent surface or the display side) of the display panel may be the side where the LCOS liquid crystal cell is located. That is, the display surface of the display panel is located on the side of the silicon wafer facing the LCOS liquid crystal cell.

Further, each sub-pixel region in the display panel includes a display region and a non-display region, and the display control circuit is located in the non-display region. Since the silicon wafer is generally lightproof, in order to ensure that the light emitted from the OLED on the other side of the silicon wafer can be emergent from the display side, the silicon wafer located on a side of the OLED display substrate away from the transparent cover plate in the display region needs to be removed, and then the transparent electrode layer is formed. Optionally, if the silicon wafer is thinned to be sufficiently thin or specially treated to transmit light, the transparent electrode layer can be formed directly on the silicon wafer.

In addition, when the refractive indexes and the light transmittances of the respective film layers on the side of the silicon wafer facing the LCOS liquid crystal cell are different, the case that the film layer interfaces affect the light emergence of the OLED is easily caused. Therefore, the respective film layers on the side of the OLED display substrate away from the transparent cover plate in the display region may be removed, and a transparent material is filled, so that the refractive index of the region filled with the transparent material is uniform to ensure uniform light emergence of the OLED. At this point, step C1 may include the following steps.

In step C11, with the transparent cover plate as a substrate, all the film layers on a side of the plurality of OLEDs away from the transparent cover plate and in the display region are removed, so that at least one groove is formed in a side of the OLED display substrate away from the transparent cover plate.

When the display control circuit layer further includes a first planarization layer, a conductive pattern, and a second planarization layer. In such step C11, all the film layers located on a side of the second planarization layer away from the transparent cover plate and located in the display region may be removed, such that at least one groove is formed in a side of the second planarization layer close to the silicon wafer. The all film layers include the thinned silicon wafer. There may be one groove between every two non-display regions, that is, after step C11, a plurality of grooves is formed in a side of the second planarization layer close to the silicon wafer.

The plurality of grooves may be formed in the side of the second planarization layer close to the silicon wafer with the transparent cover plate as a substrate by adopting the single patterning process. The patterning process may be photoresist coating, exposing, developing, etching, and photoresist peeling. Pre-baking and post-baking of photoresist can be performed before and after the exposing.

Figure 14:
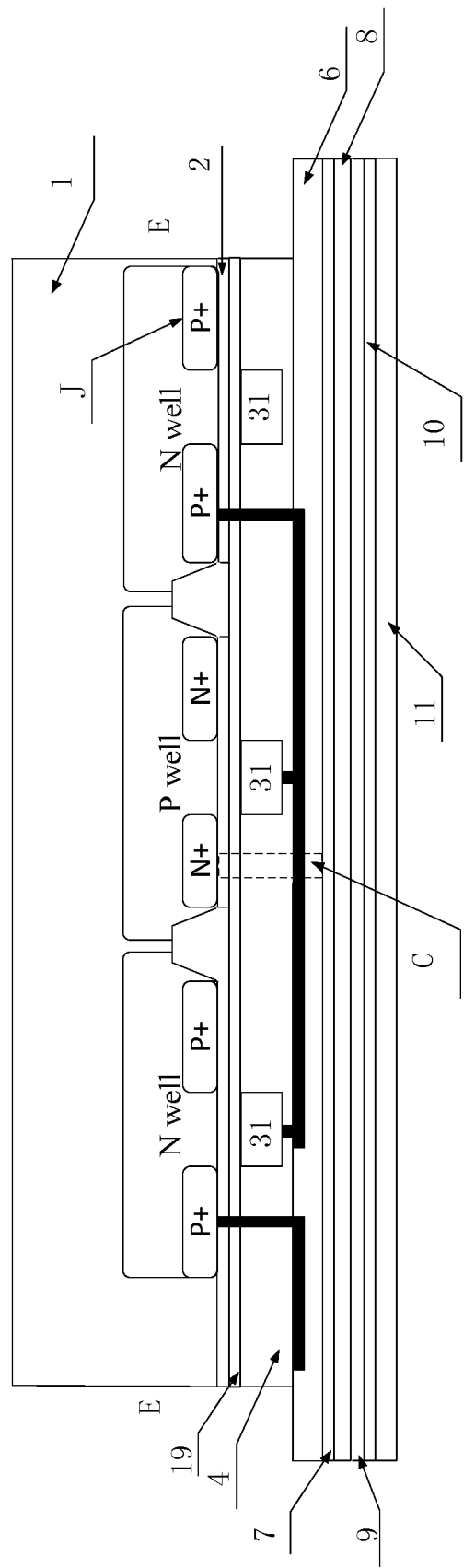
FIG. 14 is a schematic structural diagram of another display panel according to an embodiment of the present disclosure.

As shown in FIG. 14, which is a schematic view showing that with the transparent planarization cover 11 as a substrate, all the film layers in the display region on a side of the second planarization layer 6 away from the transparent cover plate are removed to form the grooves E.

In step C12, the plurality of grooves is filled with a light-transmitting material.

The plurality of grooves is filled with the light-transmitting material, and the thickness of the light-transmitting material is determined according to the hole depth. Moreover, after the filling, the chemical mechanical polishing process, the mechanical polishing process or the reverse etching process may be used to planarize the light-transmitting material to ensure smoothness of the film layer and reduce the step difference. Exemplarily, the light-transmitting material may be transparent colloid, and the transparent colloid may be resin glue.

In step C13, the transparent electrode layer is formed on the other side of the groove-filled silicon wafer.

The transparent electrode layer includes a plurality of transparent electrodes, and the transparent electrodes are connected to the output terminal of the second switching sub-circuit. Exemplarily, the transparent electrodes are connected to the second electrode of the second MOS transistor.

Optionally, a via hole may be formed in the silicon wafer firstly, for example, the via hole is formed by the single patterning process. The patterning process may be photoresist coating, exposing, developing, etching, and photoresist peeling. The etching process may be an ICP etching process. Thereafter, polysilicon may be deposited on the silicon wafer by a vapor deposition process to form a via hole protective layer.

The transparent electrode material is then coated on the via hole protective layer to form the transparent electrode layer. The transparent electrode material may be a low refractive index high polymer transparent material, such that the refractive index of the transparent electrode layer is smaller than the refractive index of the subsequently formed liquid crystal layer. Exemplarily, the transparent electrode material may be ITO. The refractive index of the transparent electrode layer is smaller than the refractive index of the subsequently formed liquid crystal layer, so that when the LCOS liquid crystal cell operates, it is ensured that when the light from the light source is incident at a specified incident angle (i.e., the light source is disposed at a specified position), the total reflection of light can be realized by the transparent electrode layer to ensure the display effect of the display panel.

Figure 15:
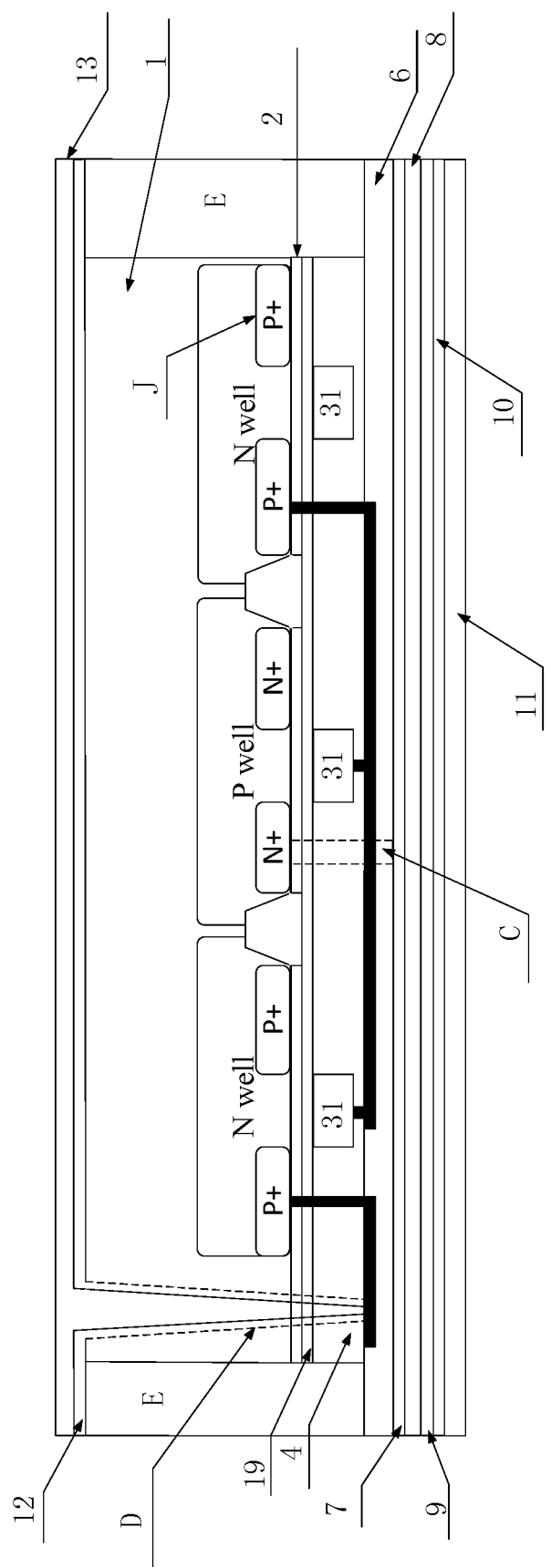
FIG. 15 is a schematic structural diagram of yet another display panel according to an embodiment of the present disclosure.

As shown in FIG. 15, which is a schematic view showing that a via hole protective layer 12 and a transparent electrode layer 13 are formed on the silicon wafer 1 provided with the grooves E shown in FIG. 14, wherein the transparent electrode layer 13 is connected to the second electrode of the second transistor by the via hole D.

In step C2, a liquid crystal layer and a transparent substrate are formed on a side of the transparent electrode layer away from the silicon wafer.

The process of sequentially forming the liquid crystal layer and the transparent substrate on a side of the transparent electrode layer away from the silicon wafer includes: forming a first alignment layer on the transparent electrode layer, forming a second alignment layer on the transparent substrate, buckling one surface of the transparent substrate where the second alignment layer is formed on the transparent electrode layer where the first alignment layer is formed for box alignment, so as to form a box body for placing the liquid crystal layer. Liquid crystal is injected into the box body to form the liquid crystal layer. Optionally, the transparent substrate may be made of a glass or quartz material.

In step 206, a polarizer is attached to a side of the LCOS liquid crystal cell away from the silicon wafer, and another polarizer is attached to a side of the transparent cover plate away from the silicon wafer.

Figure 16:
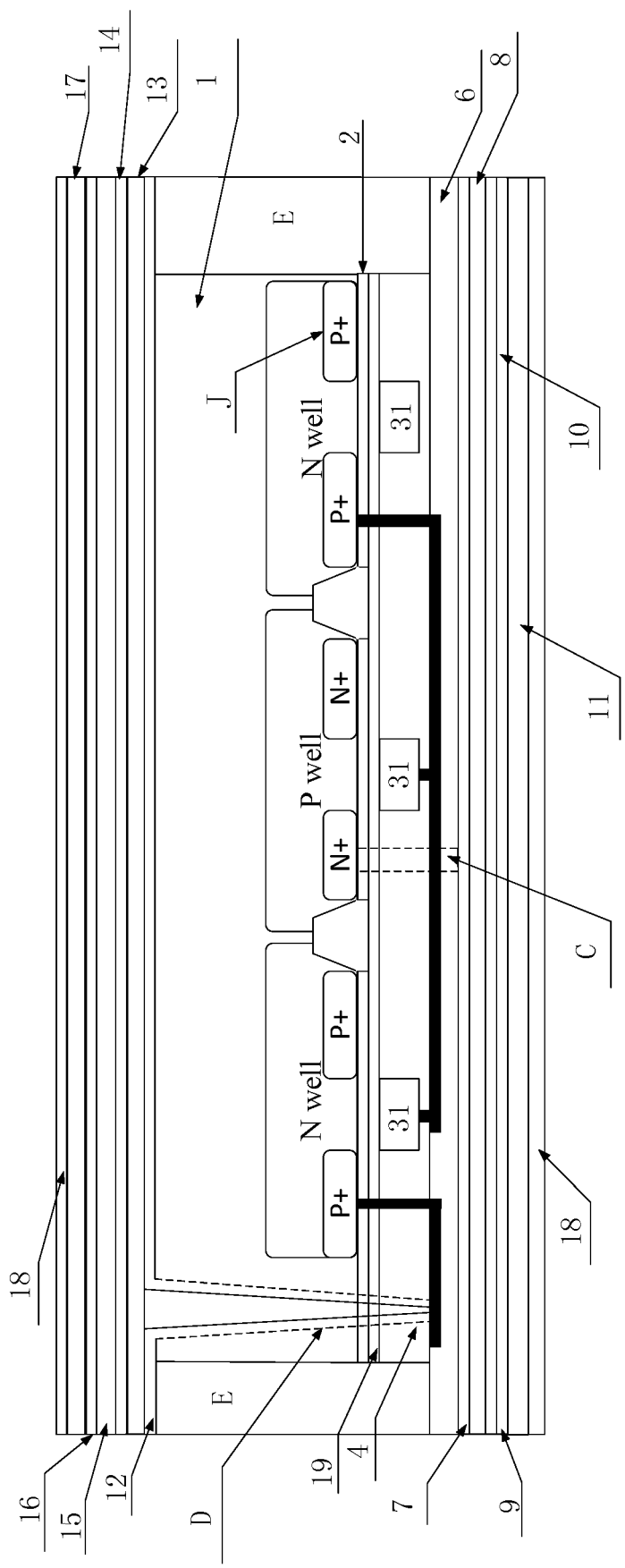
FIG. 16 is a schematic structural diagram of still yet another display panel according to an embodiment of the present disclosure.

After the polarizers are attached, the display panel is completely manufactured. As shown in FIG. 16, which is a schematic structural view of a display panel. In FIG. 16, a first alignment layer 14, a liquid crystal layer 15, a second alignment layer 16, and a transparent substrate 17 are sequentially laminated on the transparent electrode layer 13. The polarizers 18 are attached to a side of the transparent substrate 17 away from the silicon wafer and a side of the transparent cover plate 11 away from the silicon wafer.

Figure 17:
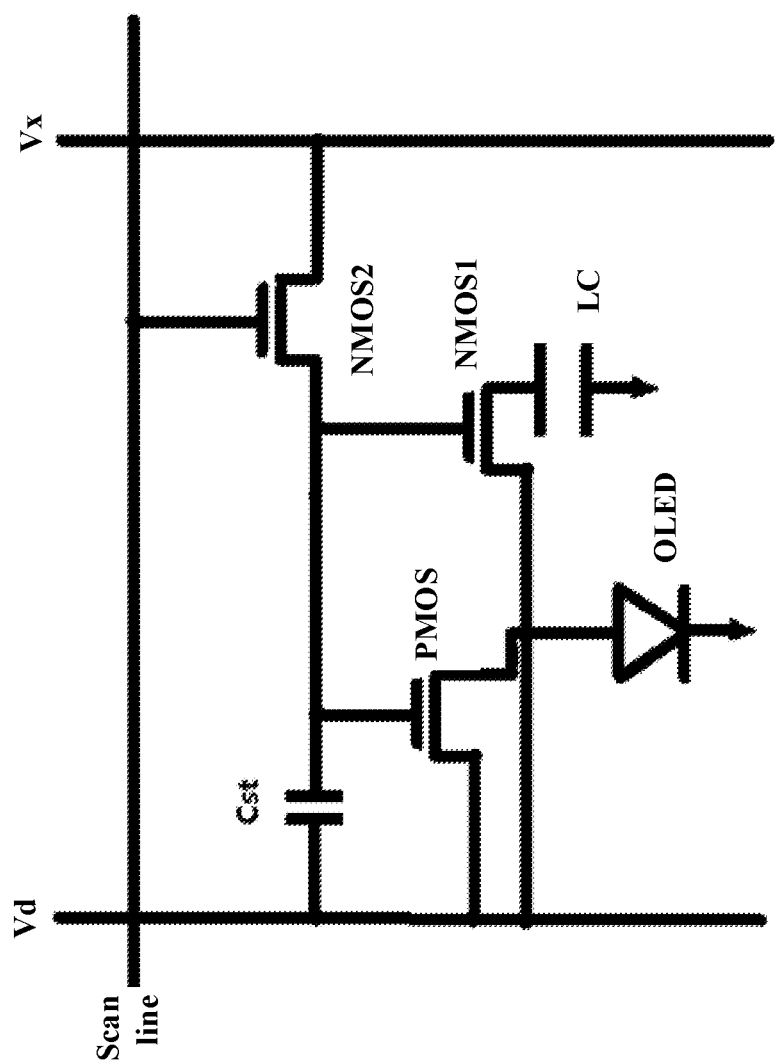
FIG. 17 is a diagram of a control circuit of a display panel according to an embodiment of the present disclosure.

Referring to FIG. 17, FIG. 17 shows an equivalent circuit diagram of a display control circuit of one sub-pixel region in the display panel shown in FIG. 16. It is assumed that the sub-pixel region has two N-type MOS transistors and one P-type MOS transistor. The two N-type MOS transistors include: a second transistor NMOS1 for controlling the liquid crystal display unit, and a driving transistor NMOS2 for controlling the first transistor and the second transistor The P-type MOS transistor is a first transistor PMOS for controlling the OLED. The gate electrode of the driving transistor NMOS2 is connected to the gate driving signal terminal by a scan line, and the second electrode of the driving transistor NMOS2 is respectively connected to the gate electrode of the second transistor NMOS1 and the gate electrode of the first transistor PMOS. The first electrode of the driving transistor NMOS2 is connected to the control signal terminal by a signal line Vx. The first electrode of the first transistor PMOS is connected to the data signal terminal by a signal line Vd. The second electrode of the first transistor PMOS is connected to the anode of the OLED. The first electrode of the second transistor NMOS1 is connected to the data signal terminal by the signal line Vd. The second electrode of the second transistor NMOS1 is connected to the transparent electrode of the liquid crystal display unit, Optionally, a storage capacitor Cst may be further disposed between the second electrode of the driving transistor NMOS2 and the signal line Vd. For each MOS transistor, the first electrode may be one of the source electrode and the drain electrode, and the second electrode may be the other of the source electrode and the drain electrode. Exemplarily, the first electrode is the source electrode, and the second electrode is the drain electrode, or the first electrode is the drain electrode and the second electrode is the source electrode.

When the driving transistor NMOS2 is turned on under control of the signal provided by the scan line, the signal supplied from the signal line Vx connected thereto is transmitted to the gate electrode of the first transistor PMOS and the gate electrode of the second transistor NMOS1 by the driving transistor NMOS2. Under control of the signal provided by the signal line Vx, the first transistor PMOS is turned on, the signal provided by the signal line Vd is loaded on the anode of the OLED, and the OLED starts to work. At the same time, the second transistor NMOS1 is turned off, and the liquid crystal display unit stops operation. Alternatively, under control of the signal provided by the signal line Vx, the first transistor PMOS is turned off, and the OLED stops operation. At the same time, the second transistor NMOS1 is turned on, the signal provided by the signal line Vd is loaded on the transparent electrode of the liquid crystal display unit, and the liquid crystal display unit starts to operate. In this way, the conduction of the second transistor NMOS1 and the first transistor PMOS at different periods of time can be realized, and the operation of the OLED and the liquid crystal display unit at different periods of time can be realized correspondingly.

In summary, according to the manufacturing method for a display panel provided by the embodiment of the present disclosure, the display control circuit layer, the OLED display substrate, and the transparent cover plate are formed on one side of the silicon wafer with the silicon wafer as a substrate. With the transparent cover plate as a substrate, the other side of the silicon wafer is thinned, and then the LCOS liquid crystal cell is formed on the other side of the thinned silicon wafer. Under control of the first switching sub-circuit and the second switching sub-circuit in the display control circuit, the OLEDs in the OLED display substrate and the liquid crystal display units in the LCOS liquid crystal cell operate at different periods of time, so that the OLED display substrate and the LCOS liquid crystal cell can be used in a targeted manner in different use environments, thereby ensuring better display effect of the display panel under different use environments, and saving power consumption simultaneously. Moreover, since the display panel is subjected to the thinning treatment, the thinning of the panel can be achieved on the basis of ensuring the display effect.

Figure 18:
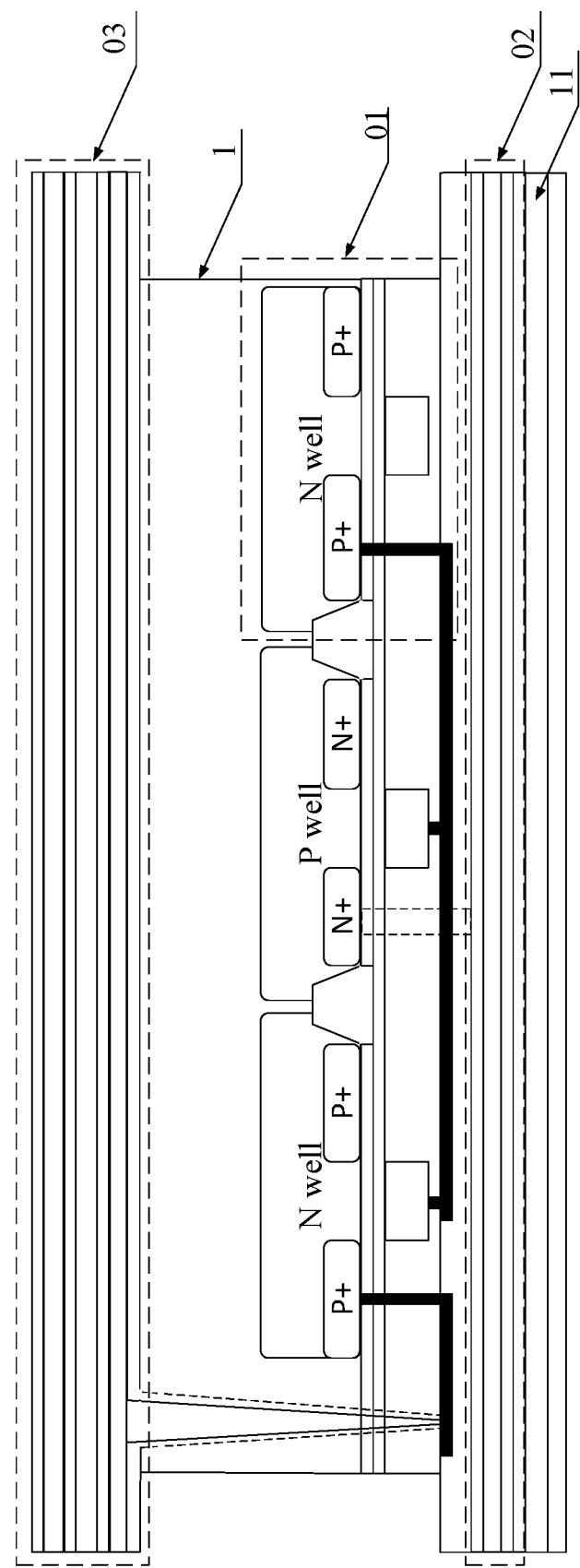
FIG. 18 is a schematic structural diagram of a display panel according to yet another exemplary embodiment.

The embodiment of the present disclosure provides a display panel, which can solve the problem that the current OLED display panel has a relatively poor display effect in a high-brightness environment. As shown in FIG. 18, the display panel includes: a silicon wafer 1; a display control circuit layer, an OLED display substrate, and a transparent cover plate 11 which are sequentially laminated on one side of the silicon wafer 1; the display control circuit layer includes a plurality of display control circuits 01, and the OLED display substrate includes a plurality of OLEDs 02; and an LCOS liquid crystal cell located on the other side of the silicon wafer 1. The LCOS liquid crystal cell includes a plurality of liquid crystal display cells 03, and the other side is opposite to the one side.

The display control circuit 01 includes: a first switching sub-circuit for controlling an operating state of the OLED 02, a second switching sub-circuit for controlling an operating state of the liquid crystal display unit 03, and a driving sub-circuit for controlling the operating state of the switching sub-circuit and the operating state of the second switching sub-circuit, the first switching sub-circuit and the second switching sub-circuit operating at different periods of time.

It should be noted that, for convenience of viewing, FIG. 18 shows part of the structure of one sub-pixel in the display panel.

In summary, according to the display panel provided by the embodiment of the present disclosure, the display control circuit layer, the OLED display substrate, and the transparent cover plate 11 are sequentially laminated on one side of the silicon wafer 1 in the display panel, and the LCOS liquid crystal cell is disposed on the other side of the silicon wafer. Under control of the first switching sub-circuit and the second switching sub-circuit in the display control circuit, the OLEDs 02 in the OLED display substrate and the liquid crystal display units 03 in the LCOS liquid crystal cell work at different periods of time, so that the OLED display substrate and the LCOS liquid crystal cell can be used in a targeted manner in different use environments, thereby ensuring that the display panel has a good display effect in different use environments.

Optionally, the driving sub-circuit includes: a driving transistor, the first switching sub-circuit includes: a first transistor, and the second switching sub-circuit includes: a second transistor. Besides, the display panel has a plurality of sub-pixel regions, each of which has the OLED 02, the liquid crystal display unit 03, and the display control circuit. At this point, referring to FIG. 15, the display control circuit layer may include: Q ion implantation regions in the silicon wafer 1 which are located in each sub-pixel region, wherein each of the ion implantation regions includes a source-drain electrode pattern J and an active pattern of which the implanted ions have opposite polarities, the implanted ions of the active patterns in at least two ion implantation regions in each sub-pixel region have opposite polarities, the source-drain electrode pattern J includes a source electrode and a drain electrode, and Q is the total number of transistors in the sub-pixel region; a gate insulating layer 2 on one side of the silicon wafer 1 provided with the ion implantation regions; and a gate electrode pattern 31 on a side of the gate insulating layer 2 away from the silicon wafer 1. The gate electrode pattern 31 includes a plurality of gate electrodes, and the orthographic projection of each gate electrode on the silicon wafer 1 is located between the source electrode and the drain electrode in one ion implantation region.

Exemplarily, when the display control circuit includes the driving transistor, the first transistor, and the second transistor, each of the sub-pixel regions of the silicon wafer 1 has three ion implantation regions, and each of the ion implantation regions includes the source-drain electrode pattern J and the active pattern of which the implanted ions have opposite polarities. The active patterns in the two ion implantation regions of the three ion implantation regions are the P-well regions shown in FIG. 15, and the active pattern in another ion implantation region is the N-well region shown in FIG. 15. Or, the active patterns in the two ion implantation regions of the three ion implantation regions are the P-well regions, and the active pattern in another ion implantation region is the N-well region, which is not specifically limited in the embodiment of the present disclosure.

Optionally, as shown in FIG. 15, the display panel may further include: a first planarization layer 4 located on a side of the gate electrode pattern 31 away from the silicon wafer 1, and a conductive pattern 5 on a side the first planarization layer 4 away from the silicon wafer 1. The conductive pattern 5 includes a first sub-pattern 5a and a second sub-pattern 5b which are insulated from each other in each sub-pixel region. The first sub-pattern 5a is connected to the gate electrode of the first transistor, the gate electrode of the second transistor and the first electrode of the driving transistor in the sub-pixel region where the first sub-pattern 5a is located by the three via holes respectively. The second sub-pattern 5b is connected to the first electrode of the second transistor in the sub-pixel region where the second sub-pattern 5b is located by the via hole.

In addition, as shown in FIG. 15, the display panel may further include: a second planarization layer 6 located on a side of the conductive pattern 5 away from the silicon wafer 1. At this point, the OLED display substrate is located on a side of the second planarization layer 6 away from the silicon wafer 1. Each OLED 02 in the OLED display substrate may be connected to the second electrode of the first transistor in the same sub-pixel unit by a via hole.

Optionally, as shown in FIG. 15, the LCOS liquid crystal cell may include: a transparent electrode layer 13, a liquid crystal layer 15, and a transparent substrate 17 which are sequentially laminated on the other side of the silicon wafer 1. The transparent electrode layer 13 includes a plurality of transparent electrodes. The transparent electrodes are connected to the output terminal of the second switching sub-circuit. The refractive index of the transparent electrode layer 13 may be less than the refractive index of the liquid crystal layer 15.

The transparent electrode may be connected to the output terminal of the second switching sub-circuit through the via hole D. At this point, as shown in FIG. 15, the display panel may further include a via hole protective layer 12. Further, a first alignment layer 14 is further disposed between the liquid crystal layer 15 and the transparent electrode layer 13, and a second alignment layer 16 is further disposed between the liquid crystal layer 15 and the transparent substrate 17. Simultaneously, a polarizer 18 is further attached to the side of the transparent substrate 17 away from the silicon wafer.

Further, the display panel has a plurality of sub-pixel regions, each of the sub-pixel regions includes a display region and a non-display region, and the display control circuit is located in the non-display region. At this point, as shown in FIG. 15, the display panel may further include a light-transmitting material filled in the grooves E between the OLED display substrate and the transparent electrode layer 13 and located in the display region.

Optionally, as shown in FIG. 15, the OLED display substrate includes: a first electrode layer, a self-light-emitting layer 8 and a second electrode layer which are laminated. The first electrode layer includes a plurality of first electrode blocks. The first electrode blocks are connected to the output terminal of the first switching sub-circuit. Another polarizer 18 is attached to a side of the transparent cover plate 11 away from the silicon wafer.

Moreover, the display side of the display panel is the side where the LCOS liquid crystal cell is located.

Optionally, as shown in FIG. 13, the display panel further includes: a thin film encapsulation layer 10 located on a side of the OLED display substrate away from the silicon substrate.

Those skilled in the art clearly know that for the convenience and briefness of description, the specific structure of the display panel described above may refer to the corresponding structure in the above method embodiments, and details are not described herein again.

In summary, according to the display panel provided by the embodiment of the present disclosure, the display control circuit layer, the OLED display substrate, and the transparent cover plate layer are sequentially laminated on one side of the silicon wafer, and the LCOS liquid crystal cell is disposed on the other side of the silicon wafer. Under control of the first switching sub-circuit and the second switching sub-circuit in the display control circuit, the OLEDs in the OLED display substrate and the liquid crystal display units in the LCOS liquid crystal cell operate at different periods of time, so that the OLED display substrate and the LCOS liquid crystal cell can be used in a targeted manner in different use environments, thereby ensuring that the display panel has a better display effect in different use environments, and saving the power consumption simultaneously.

The embodiment of the present disclosure provides a display device, which includes any display panel provided by the embodiment of the present disclosure. The display device may be any product or component with a display function, such as electronic paper, a mobile phone, a tablet computer, a television, a display, a notebook computer, a digital photo frame and a navigator. The display device further includes: a light source, which may be disposed on a side of the LCOS liquid crystal cell away from the silicon wafer. Exemplarily, the light source is a laser light source, and the laser light source can provide red, green and blue three-color lasers when the LCOS liquid crystal cell operates, and the three-color laser includes red laser, green laser and blue laser. The liquid crystal display unit in the LCOS liquid crystal cell realizes high-brightness display of the display panel by reflection of the incident light source, thereby ensuring that the display panel normally displays in a high-brightness environment.

In summary, in the display device provided by the embodiment of the present disclosure, the display control circuit layer, the OLED display substrate, and the transparent cover plate are sequentially laminated one side of the silicon wafer in the display panel, and the LCOS liquid crystal cell is disposed on the other side of the silicon wafer. Under control of the first switching sub-circuit and the second switching sub-circuit in the display control circuit, the OLEDs in the OLED display substrate and the liquid crystal display units in the LCOS liquid crystal cell operate at different periods of time, so that the OLED display substrate and the LCOS liquid crystal cell can be used in a targeted manner in different use environments, thereby ensuring that the display panel has a better display effect in different use environments, and saving power consumption at the same time.

Figure 19:
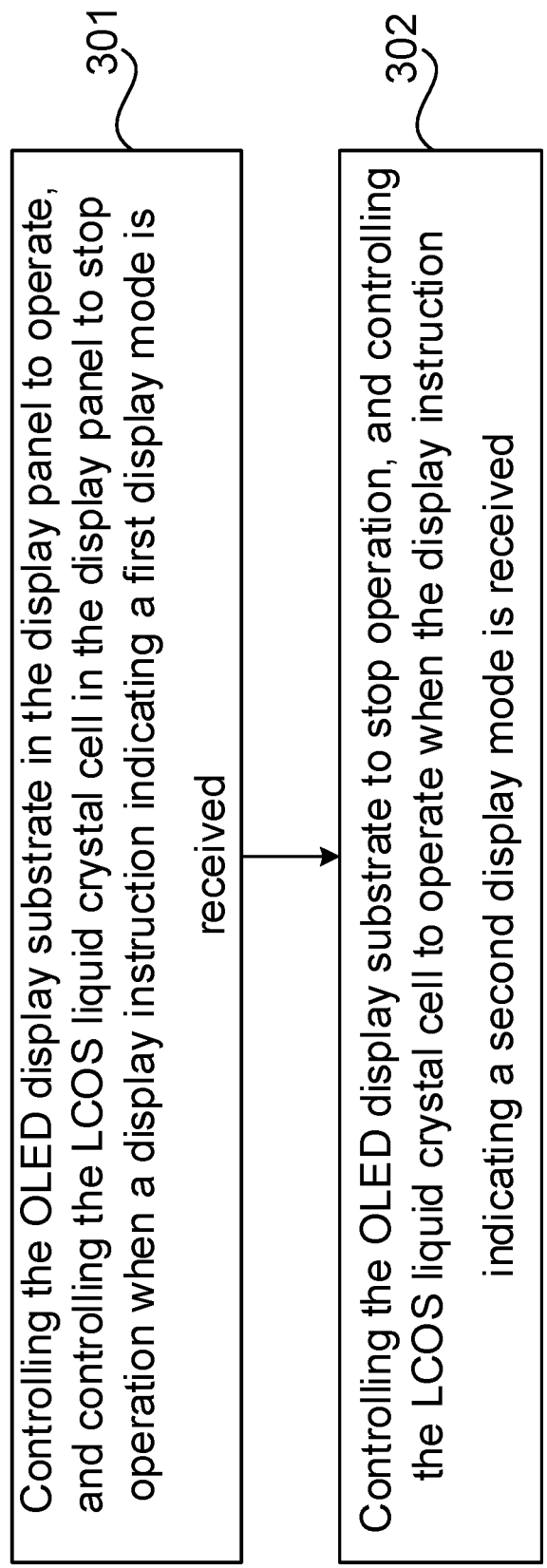
FIG. 19 is a flowchart of yet another method for controlling a display device according to an embodiment of the present disclosure.

The embodiment of the present disclosure provides a display control method, which is applied to the above display device. As shown in FIG. 19, the method includes the following steps.

In step 301, when the display instruction indicating a first display mode is received, the OLED display substrate in the display panel is controlled to operate, and the LCOS liquid crystal cell in the display panel is controlled to stop operation.

In step 302, when the display instruction indicating a second display mode is received, the OLED display substrate is controlled to stop operation, and the LCOS liquid crystal cell is controlled to operate.

The first display mode and the second display mode are determined according to the ambient light brightness of the environment where the display panel is located, and the ambient light brightness corresponding to the first display mode is greater than the ambient light brightness corresponding to the second display mode. The first display mode refers to a mode in which the OLED display substrate operates and the LCOS liquid crystal cell stops operation. The second display mode refers to a mode in which the OLED display substrate stops operation and the LCOS liquid crystal cell operates.

Further, the above method may be performed by a controller of the display device. In the embodiment of the present disclosure, the above display control method may be automatically performed by a display device, or may be triggered by a user. The embodiment of the present disclosure illustrates with the following two modes.

In the first mode, the display device automatically performs the display control method.

Exemplarily, the display device may include a light sensor for collecting the ambient light brightness of the environment where the display device is located. When the ambient light brightness collected by the light sensor is less than a preset brightness threshold, the display device generates the display instruction indicating the first display mode. Based on the display instruction, the OLED display substrate is controlled to operate, and the LCOS liquid crystal cell is controlled to stop operation. When the brightness of the ambient light collected by the light sensor is not less than the brightness threshold, the display device generates the display instruction indicating the second display mode. Based on the display instruction, the OLED display substrate is controlled to stop operation, and the LCOS liquid crystal cell is controlled to operate. Exemplarily, the above brightness threshold is 5000 $cd/m^2$.

In the second mode, the user triggers the display device to perform the display control method.

Exemplarily, the display device may have an external control component such as a control button, a button or a touch screen, and the user controls the display mode of the display device by controlling the external control component. Exemplarily, the external control component is the control button, and the control button is configured to control the switching of the display mode. When the user observes that the ambient light brightness is relatively high, and the OLED display substrate and the LCOS liquid crystal cell stop operation, the user can trigger the control button to trigger the display instruction indicating the second display mode, after receiving the display instruction indicating the second display mode, the display device controls the OLED display substrate to stop operation, and the LCOS liquid crystal cell to operate. When the user observes that the ambient light brightness is relatively low, and when the OLED display substrate stops operation, and the LCOS liquid crystal cell operates, the user can trigger the control button to trigger the display instruction indicating the first display mode. After the display device receives the display instruction indicating the first display mode, the OLED display substrate and the LCOS liquid crystal cell in the display device are controlled to stop operation.

Figure 20:
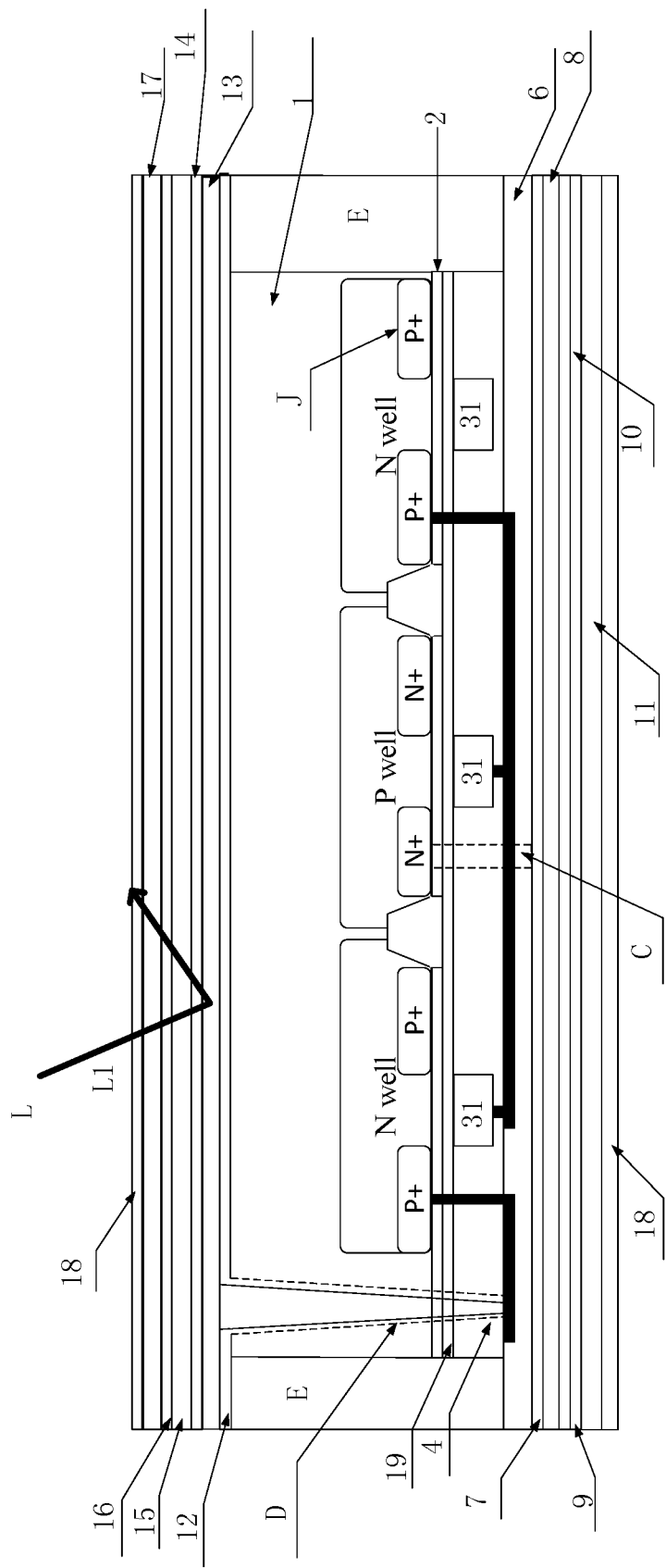
FIG. 20 is a schematic diagram showing a display process of a display device according to an embodiment of the present disclosure.
Figure 21:
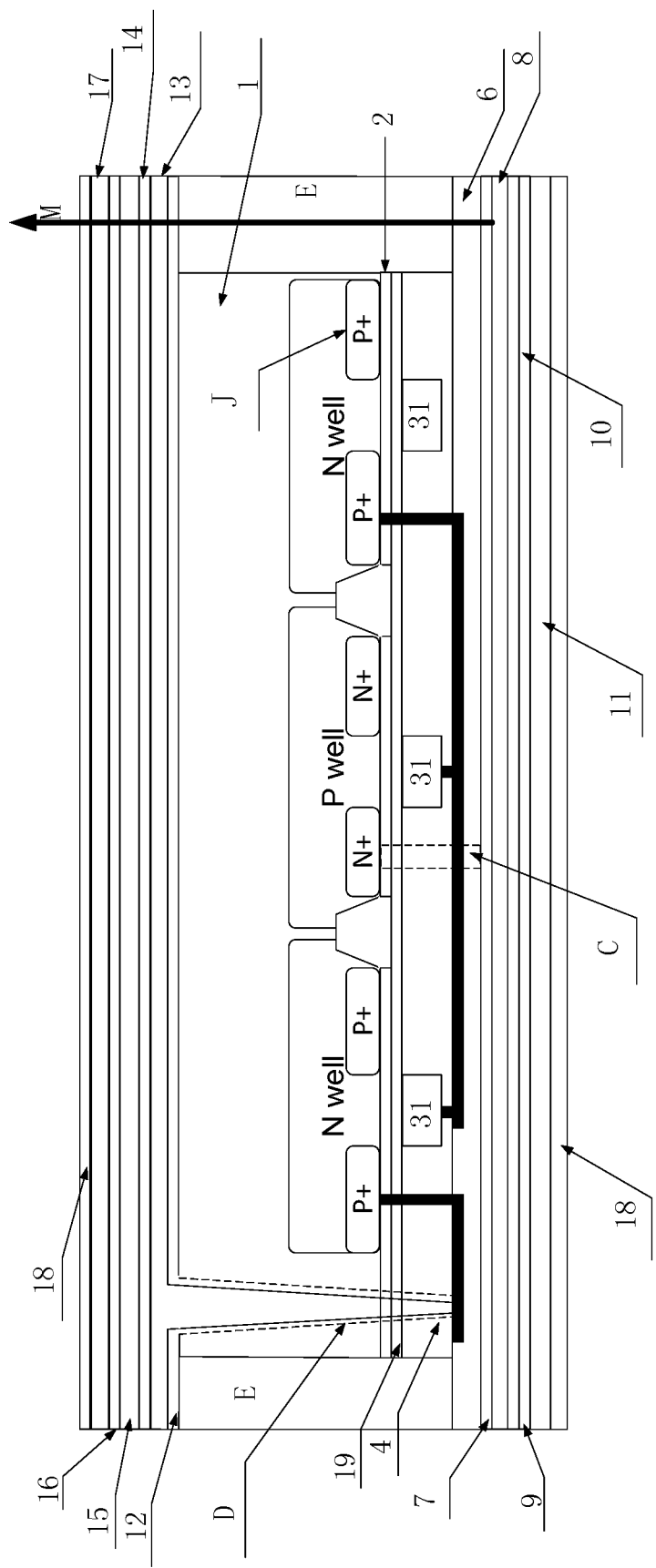
FIG. 21 is a schematic diagram of another display process of a display device according to an embodiment of the present disclosure.

Exemplarily, it is assumed that the display device automatically performs the display control method, and the brightness threshold is 2000 $cd/m^2$, when the ambient light brightness of the environment where the display device is located is greater than 2000 $cd/m^2$, for example the ambient light brightness is 3000 $cd/m^2$, the display device controls the OLED display substrate to stop operation, and the LCOS liquid crystal cell to operate. Referring to FIG. 20, the light source L emits light L1, and the transparent electrode 13 reflects the light L1. Under the cooperation of the liquid crystal layer, the display panel realizes image display by the LCOS liquid crystal cell. It is assumed that after 1 minute, the light sensor detects that the ambient light brightness is reduced to 1200 $cd/m^2$, the display device controls the OLED display substrate to operate, and the LCOS liquid crystal cell to stop operation. Referring to FIG. 21, at this point, the OLED display substrate emits light M, and the display panel realizes image display by the OLED display substrate.

In summary, according to the display control method provided by the embodiment of the present disclosure, when the display instructions are received, the signals are provided according to the modes indicated by the display instructions, so that the operation states of the OLEDs and the liquid crystal display units are controlled at different periods of time by the first switching sub-circuit and the second switching sub-circuit respectively. The OLED display substrate and the LCOS liquid crystal cell can be used in a targeted manner in different use environments. It is ensured that the display device adopts different display modes for display in different use environments, and that the display panel has a better display effect in different use environments, and the power consumption is saved simultaneously.

Other embodiments of the present disclosure will be apparent to those skilled in the art from consideration of the specification and practice of the present disclosure. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the present disclosure being indicated by the following claims.

It should be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:
1. A display panel, comprising:
   a silicon wafer;
   a display control circuit layer, an organic light emitting diode (OLED) display substrate, and a transparent cover plate which are sequentially laminated on one side of the silicon wafer, wherein the display control circuit layer comprises: a plurality of display control circuits, and the OLED display substrate comprises a plurality of OLEDs; and a liquid crystal on silicon (LCOS) liquid crystal cell on another side of the silicon wafer, wherein the LCOS liquid crystal cell comprises a plurality of liquid crystal display units, and the another side is opposite to the one side, wherein the display control circuit comprises: a first switching sub-circuit configured to control an operating state of the OLED, a second switching sub-circuit configured to control an operating state of the liquid crystal display unit, and a driving sub-circuit configured to control operating states of the first switching sub-circuit and the second switching sub-circuit, wherein the first switching sub-circuit and the second switching sub-circuit operate at different periods of time, and wherein in each of the display control circuits, the driving sub-circuit is configured to be connected to a gate driving signal terminal, a control signal terminal, and a control node respectively, and configured to provide a control signal from the control signal terminal to the control node under control of a gate driving signal from the gate driving signal terminal;

the first switching sub-circuit is configured to be connected to the control node, a data signal terminal, and the OLED in the display panel respectively, and configured to provide the data signal from the data signal terminal to the OLED under control of the control node; and the second switching sub-circuit is configured to be connected to the control node, the data signal terminal, and the liquid crystal display unit in the LCOS liquid crystal cell respectively, and configured to provide the data signal to the liquid crystal display unit under control of the control node.

2. The display panel according to claim 1, wherein the driving sub-circuit comprises: a driving transistor, the first switching sub-circuit comprises: a first transistor, and the second switching sub-circuit comprises: a second transistor.

3. The display panel according to claim 2, wherein the display panel has a plurality of sub-pixel regions, each of the sub-pixel regions has the OLED, the liquid crystal display unit, and the display control circuit therein, and the display control circuit layer comprises:

Q ion implantation regions in each of the sub-pixel regions in the silicon wafer, wherein each ion implantation region comprises a source-drain electrode pattern and an active pattern in which implanted ions have opposite polarities and the implanted ions of the active patterns in at least two ion implantation regions in each of the sub-pixel regions have opposite polarities, the source-drain electrode pattern comprises a source electrode and a drain electrode, and Q is a total number of transistors in the sub-pixel region;

a gate insulating layer on a side with the ion implantation regions of the silicon wafer; and a gate electrode pattern on a side of the gate insulating layer away from the silicon wafer, wherein the gate electrode pattern comprises a plurality of gate electrodes, and an orthographic projection of each gate electrode on the silicon wafer is between a source electrode and a drain electrode in one ion implantation region.

4. The display panel according to claim 3, wherein the display control circuit layer further comprises:

a first planarization layer on a side of the gate electrode pattern away from the silicon wafer; and a conductive pattern on a side of the first planarization layer away from the silicon wafer, wherein the conductive pattern comprises a first sub-pattern and a second sub-pattern which are insulated from each other in each sub-pixel region, the first sub-pattern is respectively connected to a gate electrode of a first transistor, a gate electrode of a second transistor, and a first electrode of a driving transistor in a sub-pixel region where the first sub-pattern is, and the second sub-pattern is connected to a first electrode of a second transistor in a pixel region where the second sub-pattern is.

5. The display panel according to claim 1, wherein the LCOS liquid crystal cell comprises: a transparent electrode layer, a liquid crystal layer, and a transparent substrate which are sequentially laminated on another side of the silicon wafer, the transparent electrode layer comprises a plurality of transparent electrodes, and the transparent electrodes are connected to an output terminal of the second switching sub-circuit.

6. The display panel according to claim 5, wherein the display panel has a plurality of sub-pixel regions, each of the sub-pixel regions comprises a display region and a non-display region, the display control circuit is in the non-display region, and the display panel further comprises: a light-transmitting material in the display region and filled between the OLED display substrate and the transparent electrode layer.

7. The display panel according to claim 1, wherein the OLED display substrate comprises: a first electrode layer, a self-light-emitting layer and a second electrode layer which are laminated, the first electrode layer comprises a plurality of first electrode blocks and the first electrode blocks are connected to an output terminal of one first switching sub-circuit.

8. The display panel according to claim 1, wherein a display side of the display panel is a side where the LCOS liquid crystal cell is.

9. The display panel according to claim 1, wherein the driving sub-circuit comprises: a driving transistor;

wherein a gate electrode of the driving transistor is connected to the gate driving signal terminal, a first electrode of the driving transistor is connected to the control signal terminal, and a second electrode of the driving transistor is connected to the control node.

10. The display panel according to claim 1, wherein the first switching sub-circuit comprises: a first transistor;

wherein a gate electrode of the first transistor is connected to the control node, a first electrode of the first transistor is connected to the data signal terminal, and a second electrode of the first transistor is connected to the OLED.

11. The display panel according to claim 1, wherein the second switching sub-circuit comprises: a second transistor;

wherein a gate electrode of the second transistor is connected to the control node, a first electrode of the second transistor is connected to the data signal terminal, and a second electrode of the second transistor is connected to the liquid crystal display unit.

12. A method for manufacturing a display panel, comprising:

forming a display control circuit layer on one side of a silicon wafer with the silicon wafer as a substrate, the display control circuit layer comprising: a plurality of display control circuits;

forming an OLED display substrate on the side of the silicon wafer on which the display control circuit layer is formed, wherein the OLED display substrate comprises a plurality of OLEDs;

disposing a transparent cover plate on a side of the OLED display substrate away from the silicon wafer; and forming an LCOS liquid crystal cell on another side of the silicon wafer with the transparent cover plate as a substrate, wherein the LCOS liquid crystal cell comprises a plurality of liquid crystal display units, and the another side is opposite to the one side;

wherein the display control circuit comprises: a first switching sub-circuit configured to control an operating state of the OLED, a second switching sub-circuit configured to control an operating state of the liquid crystal display unit, and a driving sub-circuit configured to control operating states of the first switching sub-circuit and the second switching sub-circuit, wherein the first switching sub-circuit and the second switching sub-circuit operate at different periods of time, and wherein in each of the display control circuits, the driving sub-circuit is configured to be connected to a gate driving signal terminal, a control signal terminal, and a control node respectively, and configured to provide a control signal from the control signal terminal to the control node under control of a gate driving signal from the gate driving signal terminal;

the first switching sub-circuit is configured to be connected to the control node, a data signal terminal, and the OLED in the display panel respectively, and configured to provide the data signal from the data signal terminal to the OLED under control of the control node; and the second switching sub-circuit is configured to be connected to the control node, the data signal terminal, and the liquid crystal display unit in the LCOS liquid crystal cell respectively, and configured to provide the data signal to the liquid crystal display unit under control of the control node.

13. The method according to claim 12, wherein the driving sub-circuit comprises: a driving transistor, the first switching sub-circuit comprises: a first transistor, the second switching sub-circuit comprises: a second transistor, and forming a display control circuit layer on one side of the silicon wafer with the silicon wafer as a substrate comprises:

forming a plurality of driving transistors, a plurality of first transistors, and a plurality of second transistors on the side of the silicon wafer with the silicon wafer as a substrate.

14. The method according to claim 13, wherein the display panel has a plurality of sub-pixel regions, each of the sub-pixel regions has the OLED, the liquid crystal display unit, and the display control circuit therein, and forming a plurality of driving transistors, a plurality of first transistors, and a plurality of second transistors on one side of the silicon wafer with the silicon wafer as a substrate comprises:

performing ion implantation on the silicon wafer by a first ion implantation process to obtain Q ion implantation regions in each of the sub-pixel regions in the silicon wafer, wherein implanted ions in at least two ion implantation regions in each of the sub-pixel regions have opposite polarities, and Q is a total number of transistors in the sub-pixel region;

forming a gate insulating layer on one side of the silicon wafer on which the ion implantation regions are formed;

forming a gate electrode pattern on a side of the gate insulating layer away from the silicon wafer, wherein the gate electrode pattern comprises a plurality of gate electrodes, and an orthographic projection of each gate electrode on the silicon wafer is within one ion implantation region; and forming a source-drain electrode pattern and an active pattern in each ion implantation region of the silicon wafer by a second ion implantation process, wherein a portion, in which ions are implanted by the second ion implantation process, of the ion implantation region is the source-drain electrode pattern, a portion, in which ions are not implanted by the second ion implantation process, of the ion implantation region is the active pattern, and implanted ions in the source-drain electrode pattern and in the active pattern in the same ion implantation region have opposite polarities, the source-drain electrode pattern comprises a source electrode and a drain electrode, and an orthographic projection of each gate electrode on the silicon wafer is between the source electrode and the drain electrode in one ion implantation region.

15. The method according to claim 14, wherein after forming the plurality of driving transistors, the plurality of first transistors, and the plurality of second transistors on one side of the silicon wafer with the silicon wafer as a substrate, forming a display control circuit layer on one side of the silicon wafer with the silicon wafer as a substrate further comprises:

forming a first planarization layer on the side of the silicon wafer on which the plurality of driving transistors, the plurality of first transistors, and the plurality of second transistors are formed; and forming a conductive pattern on a side of the first planarization layer away from the silicon wafer, wherein the conductive pattern comprises a first sub-pattern and a second sub-pattern which are insulated from each other in each sub-pixel region, the first sub-pattern is respectively connected to a gate electrode of a first transistor, a gate electrode of a second transistor, and a first electrode of a driving transistor in the sub-pixel region where the first sub-pattern is, and the second sub-pattern is connected to a first electrode of a second transistor in the pixel region where the second sub-pattern is.

16. The method according to claim 12, wherein forming an LCOS liquid crystal cell on another side of the silicon wafer with the transparent cover plate as a substrate comprises:

forming a transparent electrode layer on another side of the silicon wafer with the transparent cover plate as a substrate, wherein the transparent electrode layer comprises a plurality of transparent electrodes, and the transparent electrodes are connected to an output terminal of the second switching sub-circuit; and forming a liquid crystal layer and a transparent substrate on a side of the transparent electrode layer away from the silicon wafer to obtain the LCOS liquid crystal cell.

17. The method according to claim 16, wherein the display panel has a plurality of sub-pixel regions, the sub-pixel region comprises a display region and a non-display region, the display control circuit is in the non-display region, and forming a transparent electrode layer on another side of the silicon wafer with the transparent cover plate as a substrate comprises:

removing all film layers on a side of the OLED display substrate away from the transparent cover plate and in the display region with the transparent cover plate as a substrate, to form at least one groove the side of the OLED display substrate away from the transparent cover plate;

filling the at least one groove with a light-transmitting material; and forming the transparent electrode layer on the another side of the silicon wafer after the groove is filled.

18. A display control method, applied to control a display panel comprising:

a silicon wafer;

a display control circuit layer, an organic light emitting diode (OLED) display substrate, and a transparent cover plate which are sequentially laminated on one side of the silicon wafer, wherein the display control circuit layer comprises: a plurality of display control circuits, and the OLED display substrate comprises a plurality of OLEDs; and a liquid crystal on silicon (LCOS) liquid crystal cell on another side of the silicon wafer, wherein the LCOS liquid crystal cell comprises a plurality of liquid crystal display units, and the another side is opposite to the one side, wherein the display control circuit comprises: a first switching sub-circuit configured to control an operating state of the OLED, a second switching sub-circuit configured to control an operating state of the liquid crystal display unit, and a driving sub-circuit configured to control operating states of the first switching sub-circuit and the second switching sub-circuit, wherein the first switching sub-circuit and the second switching sub-circuit operate at different periods of time, wherein in each of the display control circuits, the driving sub-circuit is configured to be connected to a gate driving signal terminal, a control signal terminal, and a control node respectively, and configured to provide a control signal from the control signal terminal to the control node under control of a gate driving signal from the gate driving signal terminal;

the first switching sub-circuit is configured to be connected to the control node, a data signal terminal, and the OLED in the display panel respectively, and configured to provide the data signal from the data signal terminal to the OLED under control of the control node; and the second switching sub-circuit is configured to be connected to the control node, the data signal terminal, and the liquid crystal display unit in the LCOS liquid crystal cell respectively, and configured to provide the data signal to the liquid crystal display unit under control of the control node, and wherein the display control method comprises:

controlling the OLED display substrate in the display panel to operate and controlling the LCOS liquid crystal cell in the display panel to stop operation when a display instruction indicating a first display mode is received; and controlling the OLED display substrate to stop operation and controlling the LCOS liquid crystal cell to operate when a display instruction indicating a second display mode is received; wherein the first display mode and the second display mode are determined based on an ambient light brightness of environment in which the display panel is, and an ambient light brightness that the first display mode corresponds to is greater than an ambient light brightness that the second display mode corresponds to.

19. The display control method according to claim 18, comprising:

controlling to provide the gate driving signal at a first potential and a first control signal at the first potential to the driving sub-circuit when the display instruction indicating the first display mode is received, wherein the driving sub-circuit provides the first control signal to the control node under control of the gate driving signal, and the first switching sub-circuit provides the data signal from the data signal terminal to the OLED in the display panel under control of the control node; and controlling to provide the gate driving signal at the first potential and providing a second control signal at the second potential to the driving sub-circuit when the display instruction indicating the second display mode is received, wherein the driving sub-circuit provides the second control signal to the control node under control of the gate driving signal, and the second switching sub-circuit provides the data signal to the liquid crystal display unit in the display panel under control of the control node.

\* \* \* \* \*